(12) United States Patent
Kuriki

(10) Patent No.: US 10,468,453 B2
(45) Date of Patent: Nov. 5, 2019

(54) LIGHT-EMITTING APPARATUS

(71) Applicants: CITIZEN ELECTRONICS CO., LTD., Fujiyoshida-shi, Yamanashi (JP); CITIZEN WATCH CO., LTD., Nishitokyo-shi, Tokyo (JP)

(72) Inventor: Shingo Kuriki, Minamitsuru-gun (JP)

(73) Assignees: CITIZEN ELECTRONICS CO., LTD., Fujiyoshida-Shi, Yamanashi (JP); CITIZEN WATCH CO., LTD., Nishitokyo-Shi, Tokyo (JP)

( * ) Notice: Subject to any disclaimer, the term of this patent is extended or adjusted under 35 U.S.C. 154(b) by 0 days.

(21) Appl. No.: 16/002,954

(22) Filed: Jun. 7, 2018

(65) Prior Publication Data
US 2018/0358402 A1 Dec. 13, 2018

(30) Foreign Application Priority Data
Jun. 8, 2017 (JP) ................. 2017-113702

(51) Int. Cl.
*H01L 27/15* (2006.01)
*H01L 27/32* (2006.01)
(Continued)

(52) U.S. Cl.
CPC ........ *H01L 27/156* (2013.01); *H01L 25/0753* (2013.01); *H01L 27/32* (2013.01);
(Continued)

(58) Field of Classification Search
CPC ... H01L 27/156; H01L 27/32; H01L 27/3213; H01L 27/3218; H01L 27/38; H01L 33/52; H01L 33/62; H01L 33/486; H01L 25/0753

USPC .................. 257/89, 81, 88, 91, 99, E21.273, 257/E21.274, E21.278, E25.02, E25.032, 257/E33.06, E33.062, E33.067, E33.074,
(Continued)

(56) References Cited

U.S. PATENT DOCUMENTS 8,921,873 B2 * 12/2014 Takeda ................ H01L 25/0753
257/88
9,172,012 B2 * 10/2015 Andrews ............. H01L 25/0753
(Continued)

FOREIGN PATENT DOCUMENTS

JP 2010-097890 A 4/2010
JP 4950995 B 6/2012

*Primary Examiner* — Dao H Nguyen
(74) *Attorney, Agent, or Firm* — Procopio, Cory, Hargreaves & Savitch LLP

(57) ABSTRACT

A light-emitting apparatus including a mother board, and LED packages mounted on the mother board is provided. Each of the LED packages includes: a package substrate; light-emitting regions on the package substrate, the light-emitting regions being rotationally symmetric and each including LED devices, wherein at least some of the light-emitting regions and the other light-emitting regions emit light of different colors; and sets of package electrodes on the package substrate around the light-emitting regions, the sets of package electrodes being rotationally symmetric, wherein the package electrodes of each set correspond to cathodes and anodes of the light-emitting regions capable of emitting light independently of each other. The mother board includes, for each LED package, a set of mother-board electrodes connected to one of the sets of package electrodes of the LED package.

9 Claims, 17 Drawing Sheets

(51) Int. Cl.
    *H01L 33/48*          (2010.01)
    *H01L 33/52*          (2010.01)
    *H01L 33/62*          (2010.01)
    *H01L 25/075*        (2006.01)

(52) U.S. Cl.
    CPC ...... *H01L 27/3213* (2013.01); *H01L 27/3218* (2013.01); *H01L 33/486* (2013.01); *H01L 33/52* (2013.01); *H01L 33/62* (2013.01)

(58) Field of Classification Search
    USPC ............ 257/E33.075; 313/498; 315/294, 32; 345/76, 87; 362/84, 362, 382; 438/27, 438/29
    See application file for complete search history.

(56) References Cited

U.S. PATENT DOCUMENTS

| | | | |
|---|---|---|---|
| 9,412,914 B2 * | 8/2016 | Oka | .................... H01L 25/0753 |
| 2005/0122031 A1 * | 6/2005 | Itai | ........................ H01L 33/486 |
| | | | 313/498 |
| 2008/0239718 A1 | 10/2008 | Huttner et al. | |
| 2010/0097811 A1 | 4/2010 | Betsuda | |
| 2010/0118532 A1 * | 5/2010 | Liang | ...................... F21S 2/005 |
| | | | 362/235 |
| 2013/0161655 A1 * | 6/2013 | Xu | ...................... H01L 25/0753 |
| | | | 257/88 |

* cited by examiner

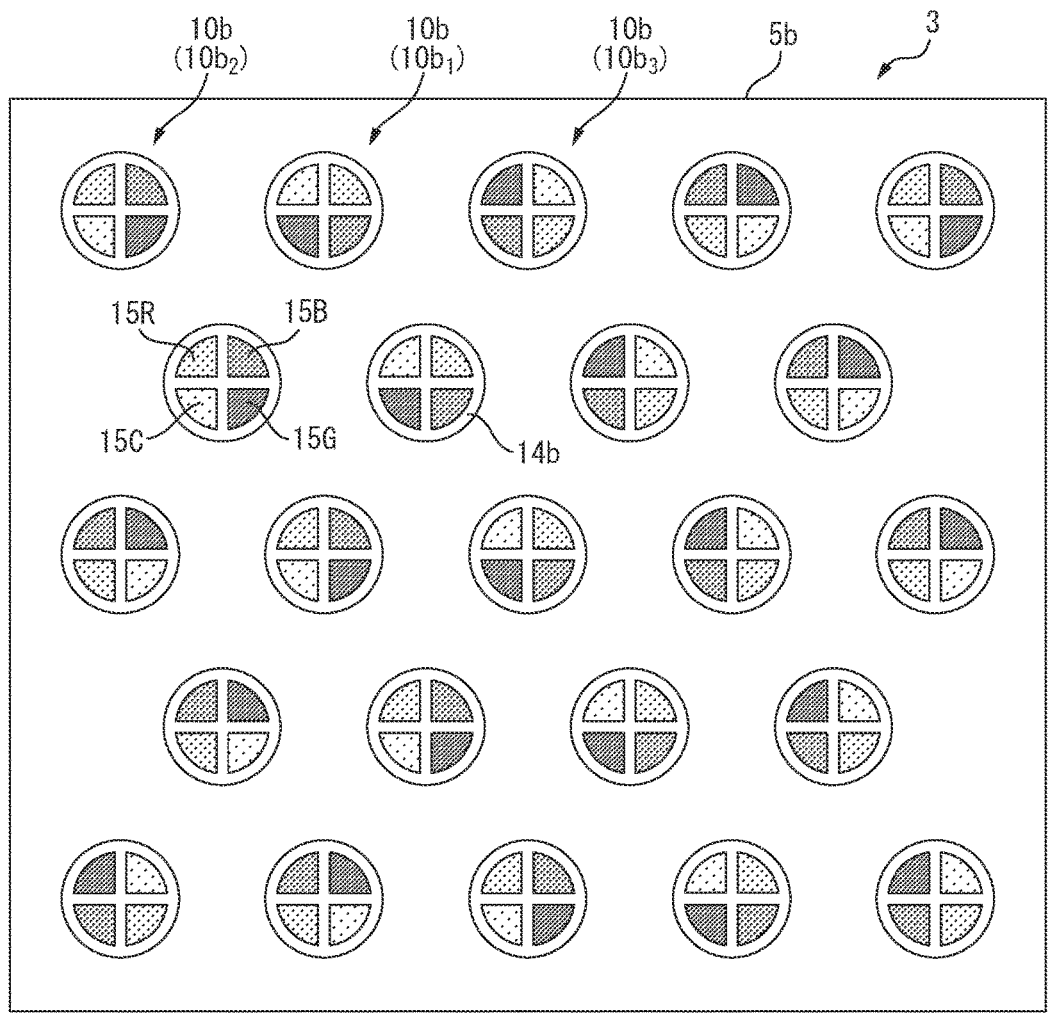
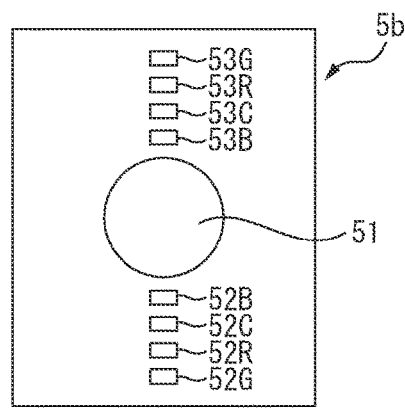
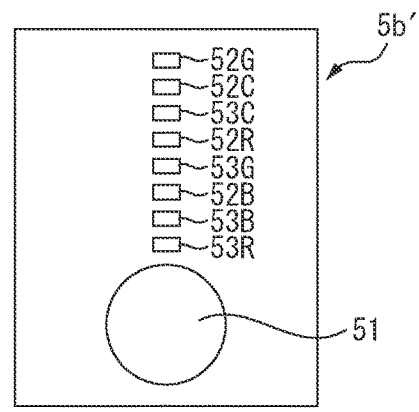

LIGHT-EMITTING APPARATUS

CROSS REFERENCE TO RELATED APPLICATION

This application claims the benefit of Japanese Patent Application JP2017-113702, filed on Jun. 8, 2017. The disclosure of JP2017-113702 is herein incorporated by reference.

TECHNICAL FIELD OF THE INVENTION

The present invention relates to a light-emitting apparatus.

BACKGROUND OF THE INVENTION

Chip-On-Board (COB) light-emitting apparatuses are known in which light-emitting diode (LED) devices are mounted on a substrate and sealed with a translucent resin containing a phosphor. Some of such light-emitting apparatuses have a light-emitting region divided into multiple sub-regions by a dam member.

SUMMARY OF THE INVENTION

In order to obtain a large amount of emitted light of different colors, it is conceivable to produce a light-emitting apparatus that includes light-emitting units mounted on a single mother board, each light-emitting unit including multiple light-emitting regions which emit light of different colors. In this case, it is preferable for the light-emitting apparatus to include the same LED packages, as the light-emitting units, since only a small variety of components is required to produce such an apparatus. However, if the same LED packages each including multiple light-emitting regions which emit light of different colors are uniformly arranged on the mother board with the same arrangement angle, color unevenness of emitted light may be conspicuous on an irradiated surface when the light-emitting regions emit light at the same time. Varying the arrangement angles from package to package may reduce such color unevenness, but requires considerable time and trouble, since electrode terminals for connection to the LED packages need to be formed on the mother board at different positions in accordance with the arrangement angles of the LED packages.

It is an object of the present invention to provide a light-emitting apparatus which can be easily produced and emits light beams of different colors from LED packages so that the light beams are mixed favorably on an irradiated surface.

A light-emitting apparatus including a mother board, and LED packages mounted on the mother board is provided. Each of the LED packages includes: a package substrate; light-emitting regions on the package substrate, the light-emitting regions being rotationally symmetric and each including LED devices, wherein at least some of the light-emitting regions and the other light-emitting regions emit light of different colors; and sets of package electrodes on the package substrate around the light-emitting regions, the sets of package electrodes being rotationally symmetric, wherein the package electrodes of each set correspond to cathodes and anodes of the light-emitting regions capable of emitting light independently of each other. The mother board includes, for each LED package, a set of mother-board electrodes connected to one of the sets of package electrodes of the LED package.

Preferably, in the light-emitting apparatus, the sets of package electrodes in each LED package have redundancy, and the number of sets of package electrodes in each LED package is not less than the number of colors of light emitted from the light-emitting regions in the LED package.

Preferably, in the light-emitting apparatus, the sets of package electrodes are arranged at intervals of an integer multiple of 360°/n around the center of the light-emitting regions, wherein n represents the number of light-emitting regions in each LED package.

Preferably, in the light-emitting apparatus, the LED packages have different arrangement angles in an upper surface of the mother board with respect to a reference direction in the upper surface. Preferably, the arrangement angles of the LED packages differ from each other by an integer multiple of 360°/n.

Preferably, in the light-emitting apparatus, each of the light-emitting regions is composed of the LED devices and a sealing resin filled on the package substrate to seal the LED devices, and each of the LED packages further includes: a dam member on the package substrate, wherein the dam member has straight-line segments extending radially from the center of the light-emitting regions and divides the light-emitting regions; and conductive patterns provided on the package substrate so as not to overlap each other, the conductive patterns electrically connecting the LED devices and the sets of package electrodes, wherein each of the conductive patterns includes a first segment extending under one of the straight-line segments of the dam member from a space between the light-emitting regions to an outer edge of the package substrate, and a second segment extending around the outer circumferences of the light-emitting regions.

Preferably, in the light-emitting apparatus, each of the light-emitting regions has a fan shape, the light-emitting regions constitute a single circular light-emitting region, the conductive patterns concentrically extend around the center of the light-emitting regions outside the single circular light-emitting region, and the package electrodes of each set are arranged on circular arcs of the conductive patterns.

Preferably, in the light-emitting apparatus, each of the sets of package electrodes is arranged on a single straight line passing through the center of the light-emitting regions, and the set of mother-board electrodes is also arranged on a single straight line, for each of the LED packages.

Preferably, in the light-emitting apparatus, the mother board has openings respectively corresponding to the LED packages, the set of mother-board electrodes is provided on a lower surface of the mother board around each of the openings, and each of the LED packages is connected to the lower surface of the mother board so that the light-emitting regions are placed in one of the openings.

BRIEF DESCRIPTION OF THE DRAWINGS

Other features and advantages of the present invention will be apparent from the ensuing description, taken in conjunction with the accompanying drawings, in which:

FIGS. 7A and 7B are top views of an LED package 10a;

FIG. 8 is a top view of the package substrate 11a of the LED package 10a;

FIG. 9 is a top view of another package substrate 11a' for the LED package 10a;

FIG. 13A is a top view of another light-emitting apparatus 3, and FIGS. 13B and 13C are partial enlarged views of mother boards 5b and 5b' for the light-emitting apparatus 3;

DESCRIPTION OF EMBODIMENTS

Hereinafter, with reference to the accompanying drawings, light-emitting apparatuses will be explained in detail. It should be noted, however, that the present invention is not limited to the drawings or the embodiments described below.

Figure 1A:
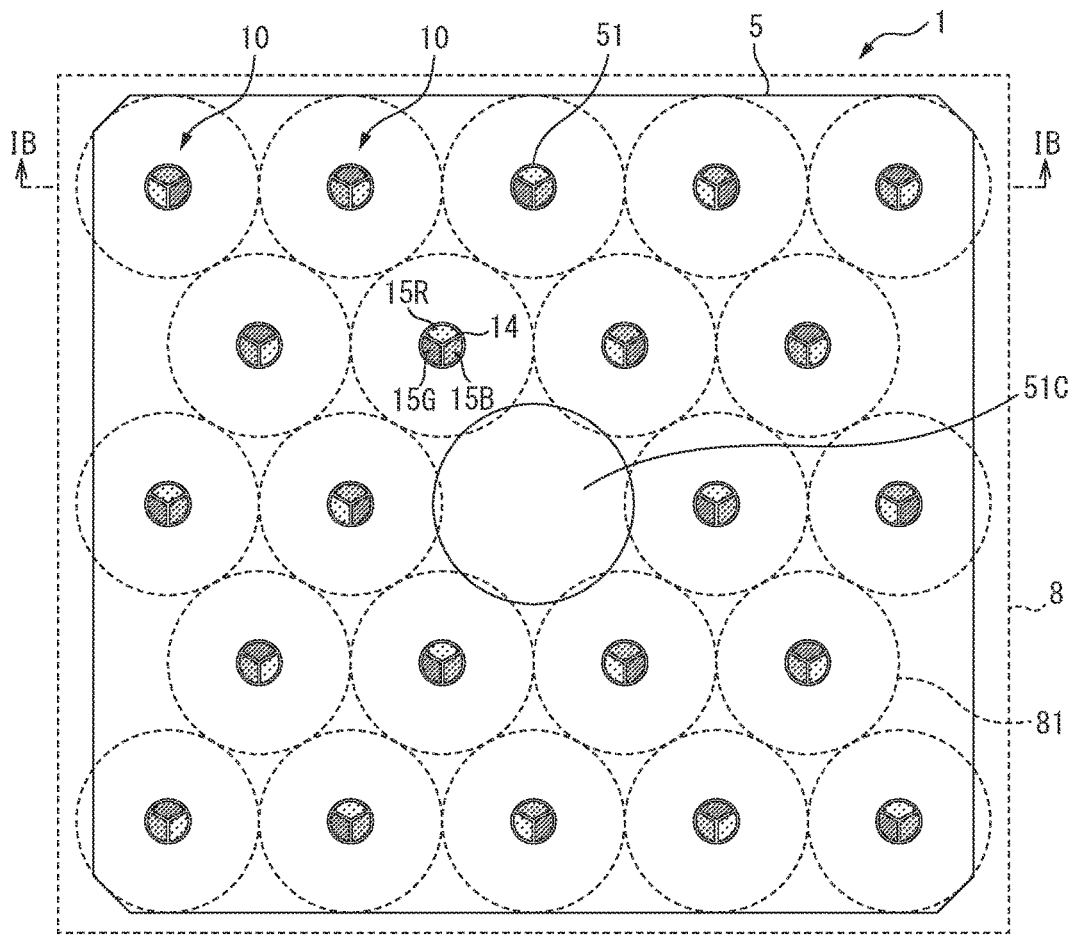
FIG. 1A is a top view of a light-emitting apparatus 1.
Figure 1B:
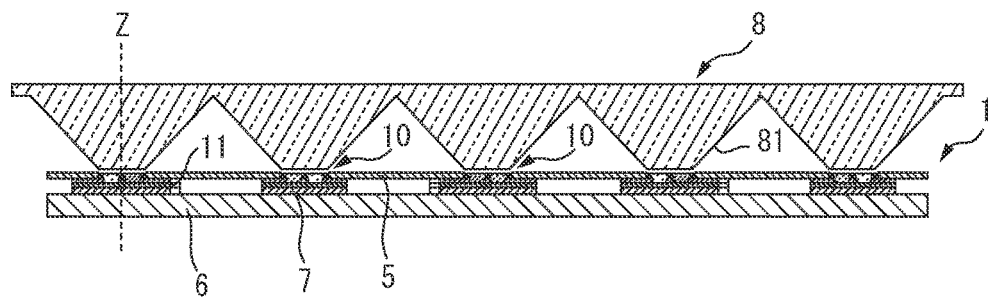
FIG. 1B is a cross-sectional view of the light-emitting apparatus 1 taken along the line IB-IB of FIG. 1A.

FIG. 1A is a top view of a light-emitting apparatus 1, and FIG. 1B is a cross-sectional view of the light-emitting apparatus 1 taken along the line IB-IB of FIG. 1A. The light-emitting apparatus 1 includes a mother board 5, a heat sinking substrate 6, heat sinking sheets 7 and LED packages 10. In the light-emitting apparatus 1, twenty-two LED packages 10 are arranged on the heat sinking substrate 6 with the heat sinking sheets 7 interposed therebetween, and the mother board 5 is arranged on the LED packages 10. Further, a lens array 8 including twenty-two lenses 81 respectively corresponding to the LED packages 10 is arranged above the light-emitting apparatus 1. Each of the LED packages 10 includes a circular light-emitting region composed of three fan-shaped regions which are indicated by reference numerals 15R, 15G and 15B in FIG. 1A and emit red, green and blue light, respectively. The light-emitting apparatus 1, together with the lens array 8, is used as an LED light source for such applications as floodlighting, high-ceiling lighting, stadium lighting and illumination.

Figure 2A:
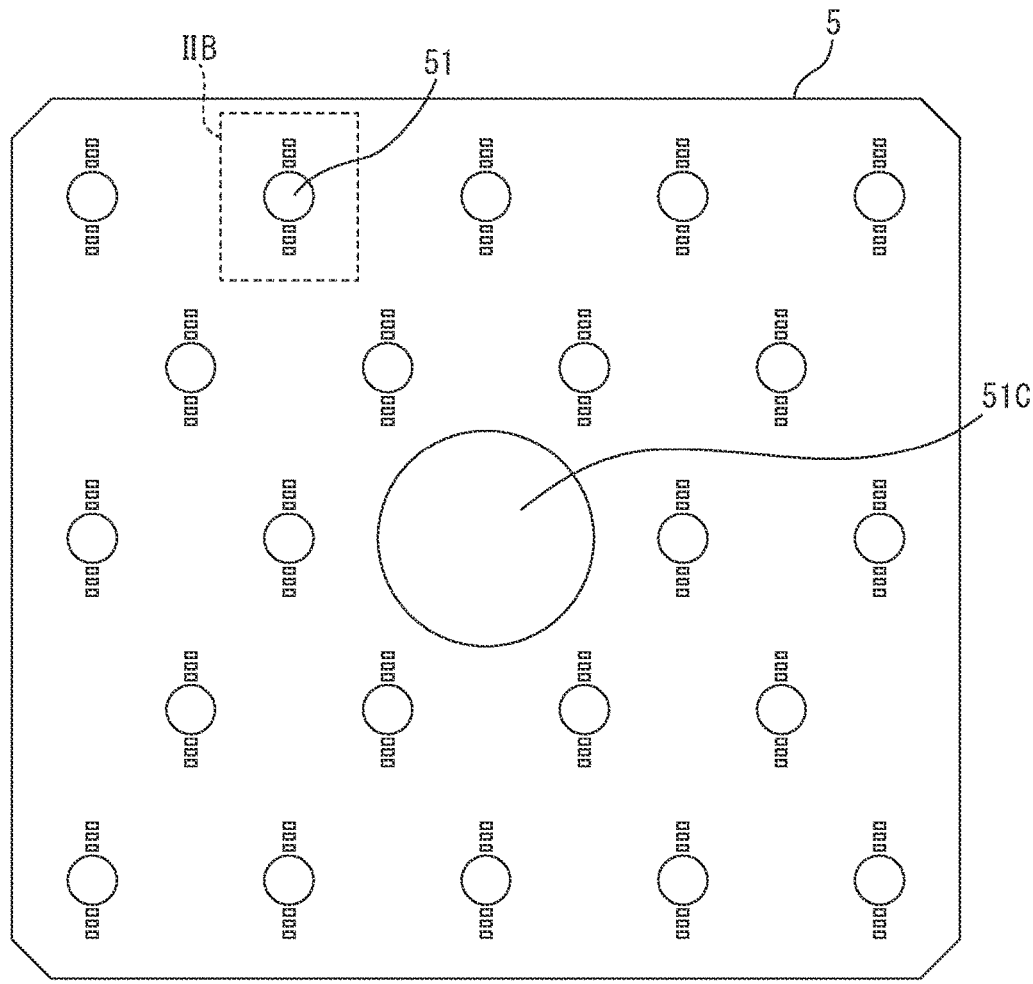
FIG. 2A is a bottom view of the mother board 5.
Figure 2B:
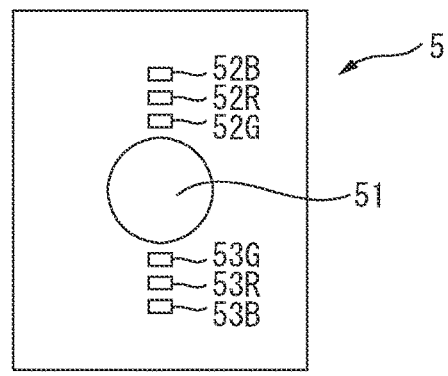
FIG. 2B is an enlarged view of the area indicated by the broken line IIB of FIG. 2A.

FIG. 2A is a bottom view of the mother board 5, and FIG. 2B is an enlarged view of the area indicated by the broken line IIB of FIG. 2A. The mother board (main circuit board) 5 is a substantially rectangular insulating substrate, such as a glass epoxy substrate, and has twenty-two evenly spaced openings 51. The LED packages 10 are mounted on the lower surface of the mother board 5 (on the lower side in FIG. 1B) at the openings 51, with the light-emitting regions of the LED packages 10 inserted into the respective openings 51. As shown in FIG. 1A, the mother board 5 has a circular opening 51C at the center thereof, where no LED package 10 is arranged. However, the opening 51C may be omitted, or another LED package 10 may be arranged at the center of the mother board 5.

The mother board 5 further includes conductive patterns for electrically connecting the LED packages 10 to each other, and electrode terminals for connecting the light-emitting apparatus 1 to an external power source, as circuitry for driving the LED packages 10. Connecting the electrode terminals to an external power source and applying a voltage across the electrode terminals causes the LED packages 10 to emit light. At this time, all of the LED packages 10 in the light-emitting apparatus 1 may emit light at the same time, or only some of the LED packages 10 may emit light, depending on the routing of the conductive patterns on the mother board 5.

As shown in FIG. 2B, on the lower surface around each of the openings 51, the mother board 5 includes a set of electrode terminals (mother-board electrodes) 52R, 53R, 52G, 53G, 52B and 53B connected to electrode terminals of one of the LED packages 10 corresponding to the opening 51. The electrode terminals 52R and 53R, the electrode terminals 52G and 53G, and the electrode terminals 52B and 53B correspond to the cathodes and anodes of the red, green and blue light-emitting regions of the LED package 10 indicated by reference numerals 15R, 15G and 15B in FIG. 1A. For each of the openings 51 (the LED packages 10), these electrode terminals are arranged on a single straight line passing through the center of the opening 51. More specifically, on one side of the opening 51, the electrode terminals 52B, 52R and 52G are arranged in this order toward the opening 51, while on the opposite side across the opening 51, the electrode terminals 53B, 53R and 53G are arranged in this order toward the opening 51.

Figure 3:
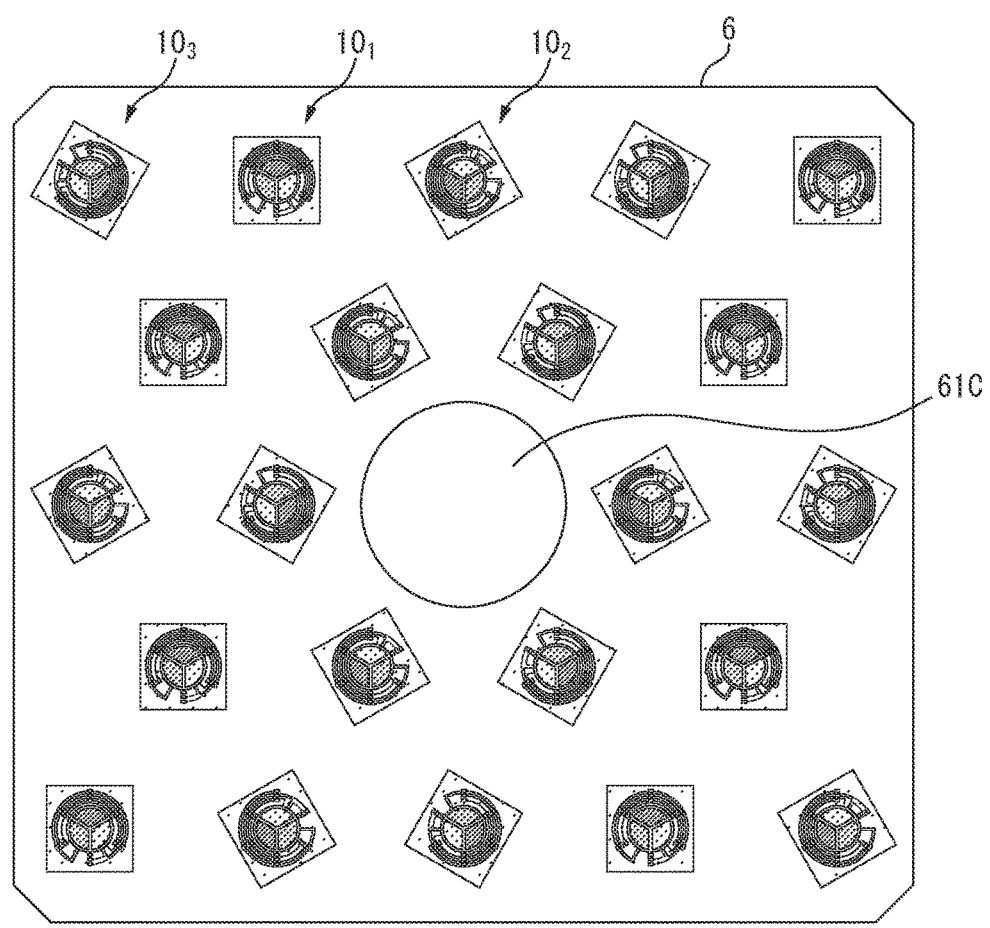
FIG. 3 is a top view showing the heat sinking substrate 6 and an arrangement of the LED packages 10.

FIG. 3 is a top view showing the heat sinking substrate 6 and an arrangement of the LED packages 10. Since it shows the upper surface of the light-emitting apparatus 1 with the mother board 5 removed, FIG. 3 illustrates only the heat sinking substrate 6 and the LED packages 10. The heat sinking substrate 6 is a substantially rectangular metal substrate arranged below the mother board 5 and the LED packages 10. In the illustrated example, the heat sinking substrate 6 has a circular opening 61C as large as the opening 51C of the mother board 5, at the center thereof; however, the opening 61C may be omitted. The heat sinking substrate 6 is made of a material such as aluminum or copper, which excels in heat resistance and heat dissipation, since it functions as a heat sink which causes heat generated by the LED packages 10 to be discharged outside the apparatus. However, the heat sinking substrate 6 may be made of another material, other than aluminum and copper, as long as it excels in heat resistance and heat dissipation.

The heat sinking sheets 7 are rubber sheets having thermal conductivity and elasticity and made of a silicon-based material, for example. The heat sinking sheets 7 each have a rectangular shape and substantially the same size as the package substrates 11 of the LED packages 10, and are provided for the respective LED packages 10. The heat sinking sheets 7 lie between the package substrates 11 and the heat sinking substrate 6.

The lens array 8 is a lens assembly including twenty-two lenses 81 integrated with each other, as shown in FIG. 1A.

The number of lenses 81 is the same as that of LED packages 10 in the light-emitting apparatus 1. The lenses 81 have the same shape and size, and are aligned with the LED packages 10. As shown in FIG. 1B, the optical axis Z of each lens 81 coincides with the direction of the normal line of the mother board 5. Each lens 81 is designed so that light emitted from the corresponding LED package 10 is collected and condensed and that light beams emitted from the LED packages 10 overlap each other at a position sufficiently distant from the light-emitting apparatus 1.

Figure 4A:
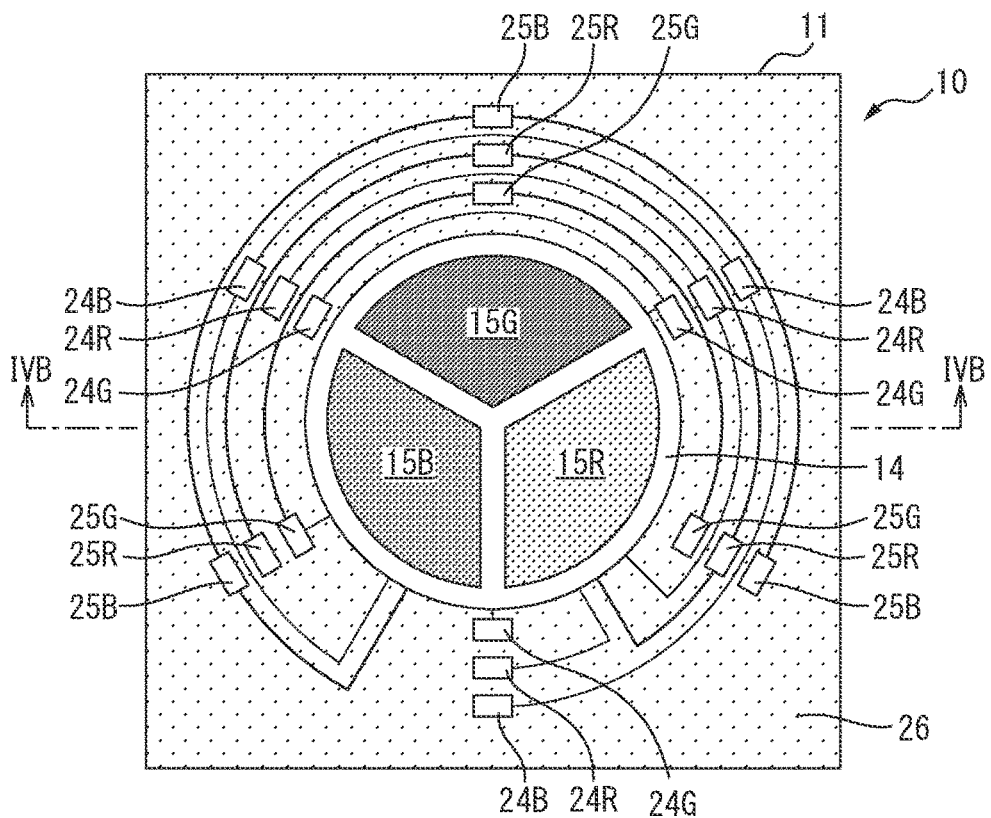
FIG. 4A is a top view of one of the LED packages 10.
Figure 4B:
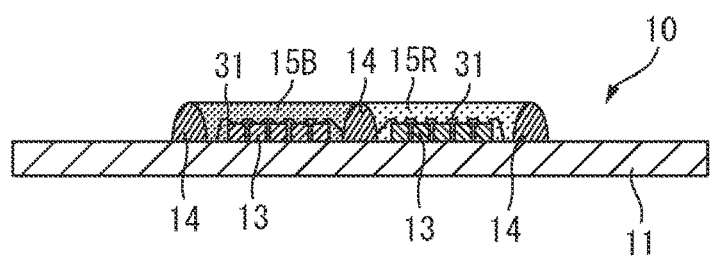
FIG. 4B is a cross-sectional view of the LED package 10 taken along the line IVB-IVB of FIG. 4A.

FIG. 4A is a top view of one of the LED packages 10, and FIG. 4B is a cross-sectional view of the LED package 10 taken along the line IVB-IVB of FIG. 4A. In addition to the package substrate 11, each of the LED packages 10 includes LED devices 13, a dam member 14 and sealing resins 15R, 15G and 15B. Each LED package 10 is connected to the mother board 5 at edges of the package substrate 11, with the dam member 14 and the sealing resins 15R, 15G and 15B inserted into the corresponding opening 51 from below the mother board 5.

Figure 5A:
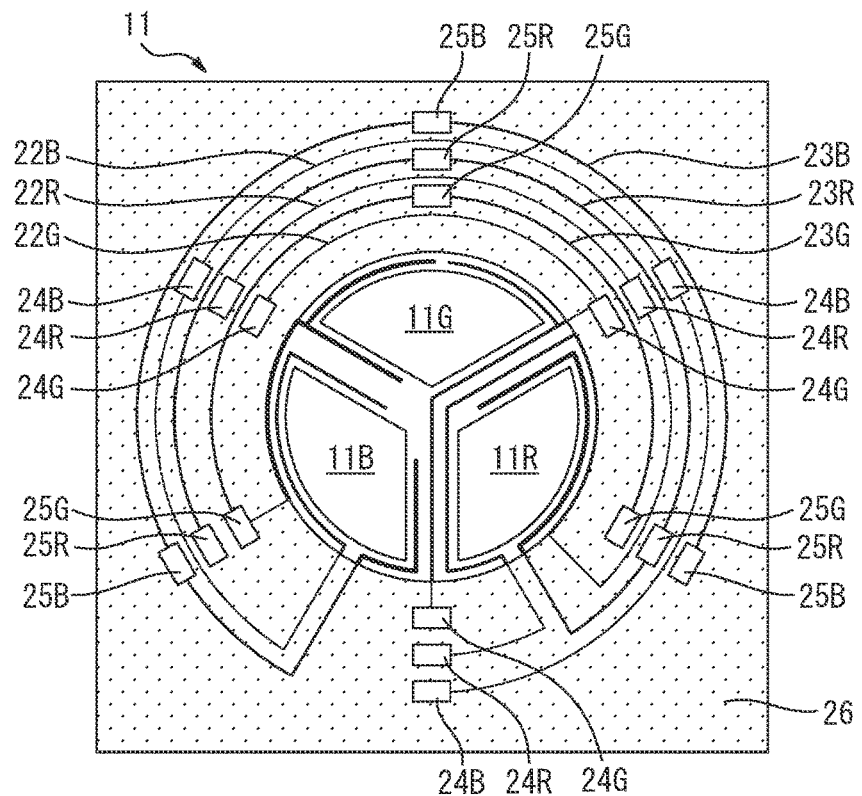
FIGS. 5A and 5B are top views of the package substrate 11 of the LED package 10.
Figure 5B:
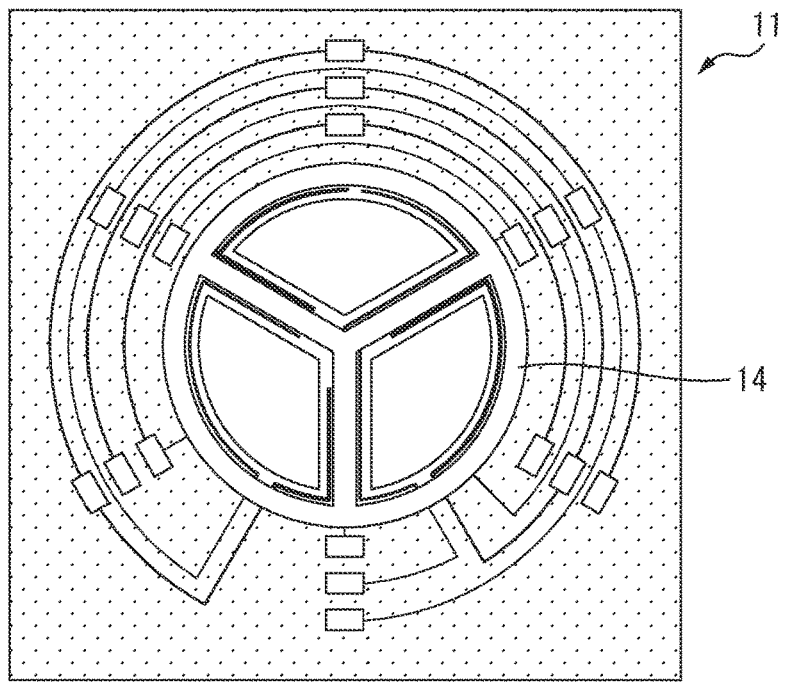

FIGS. 5A and 5B are top views of the package substrate 11 of the LED package 10. FIG. 5B shows the package substrate 11 with the dam member 14 formed on the upper surface thereof. The package substrate 11 is a rectangular flat substrate made of a material such as ceramics, which has high heat dissipation characteristics, and includes mounting regions 11R, 11G and 11B of the LED devices 13 at the center of the upper surface thereof, as shown in FIG. 5A. These three mounting regions have a fan shape with a central angle of 120°, and constitute a single circular region.

The package substrate 11 further includes conductive patterns 22R, 23R, 22G, 23G, 22B and 23B and three sets of electrode terminals (package electrodes) 24R, 25R, 24G, 25G, 24B and 25B on the upper surface thereof around the mounting regions 11R, 11G and 11B. The region on the upper surface of the package substrate 11 outside the dam member 14 is covered with a white resist 26, except for the areas of the electrode terminals. The conductive patterns 22R, 23R, 22G, 23G, 22B and 23B are thus kept out of sight by the white resist 26 in a finished product of the LED package 10.

The LED devices 13 are blue LEDs made of a gallium nitride compound semiconductor, for example, and emit blue light at a wavelength in the range of about 450 to 460 nm. In order to increase the density of emitted light, multiple LED devices 13 are densely fixed onto the upper surface of the package substrate 11 with an electrically insulating transparent adhesive, for example, in each of the mounting regions 11R, 11G and 11B. Each LED device 13 includes a pair of device electrodes on the upper surface thereof. The device electrodes of adjacent LED devices 13 are electrically connected to each other by wires (bonding wires) 31, as shown in FIG. 4B. In the mounting regions 11R, 11G and 11B, the LED devices 13 are connected to each other in series or in series-parallel between the conductive patterns 22R and 23R, between the conductive patterns 22G and 23G, and between the conductive patterns 22B and 23B, respectively. Accordingly, the LED devices 13 are supplied with a current through the wires 31.

The dam member 14 is a white resin frame for dividing the three light-emitting regions and preventing the sealing resins 15R, 15G and 15B from flowing out. The dam member 14 is fixed at the center of the upper surface of the package substrate 11, and surrounds the LED devices 13 mounted on the package substrate 11. The dam member 14 includes a circular segment extending along the outer circular arc of the mounting regions 11R, 11G and 11B, and three straight-line segments which extend radially from the center of the circle (the center of the three light-emitting regions) and divide the circle into three equal parts. The length of the three straight-line segments is the same as the radius of the circle. The dam member 14 has a reflective coating which causes light emitted laterally from the LED devices 13 to reflect toward the upper side of the light-emitting apparatus 1 (the mother board 5).

The sealing resins 15R, 15G and 15B are filled into the respective mounting regions 11R, 11G and 11B surrounded by the dam member 14 to integrally cover and protect (seal) the LED devices 13 and the wires 31. It is preferable to use a colorless and transparent resin, such as an epoxy resin or a silicone resin, in particular, a resin having a heat resistance up to about 250° C., as the sealing resins 15R, 15G and 15B.

The three fan-shaped regions which are surrounded by the dam member 14 and covered by the sealing resins 15R, 15G and 15B correspond to the red, green and blue light-emitting regions of the LED package 10. Thus, the regions of the sealing resins 15R, 15G and 15B will be simply referred to as "the light-emitting regions 15R, 15G and 15B" below. The light-emitting regions 15R, 15G and 15B, each including multiple LED devices 13, are rotationally symmetric on the package substrate 11, and constitute a single circular light-emitting region.

The sealing resin 15R contains a red phosphor, such as $CaAlSiN_3:Eu^{2+}$, which absorbs the blue light from the LED devices 13 to emit red light. Thus, the light-emitting region 15R emits red light at a wavelength in the range of about 620 to 750 nm, for example. The sealing resin 15G contains a green phosphor, such as $(BaSr)_2SiO_4:Eu^{2+}$, which absorbs the blue light from the LED devices 13 to emit green light. Thus, the light-emitting region 15G emits green light at a wavelength in the range of about 500 to 570 nm, for example. The sealing resin 15B may be a transparent resin not containing any phosphor, since the LED devices 13 are blue LEDs. The light-emitting region 15B emits blue light at a wavelength in the range of about 450 to 490 nm, for example.

As described above, all of the LED devices 13 have the same emission wavelength range, and the different phosphors are dispersedly mixed into the respective sealing resins. This simplifies the production of the LED packages 10, improves their reliability and allows the light-emitting regions to emit light of different colors. However, the emission wavelength range of the LED devices 13 may be different between the light-emitting regions.

For example, the LED devices 13 in the light-emitting region 15R may be red LEDs emitting red light, and those in the light-emitting region 15G may be green LEDs emitting green light. In this case, the sealing resin 15R may not contain a red phosphor, and the sealing resin 15G may not contain a green phosphor. Alternatively, the LED devices 13 in the light-emitting region 15B may be violet LEDs or near ultraviolet LEDs, and their emission wavelength may be in the range of about 200 to 460 nm including the ultraviolet region. In this case, the sealing resin 15B may contain a phosphor, such as $BaMgAl_{10}O_{17}:Eu^{2+}$, which absorbs the light from the LED devices 13 to emit blue light. The same applies for other LED packages to be described later.

Figure 4C:
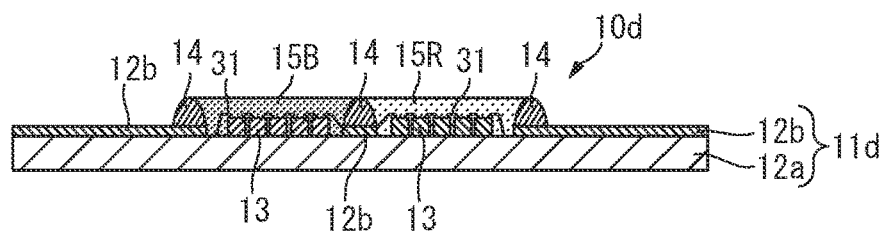
FIG. 4C is a cross-sectional view of another LED package 10d.

FIG. 4C is a cross-sectional view of another LED package 10d. The LED package 10d is identical in structure to the LED package 10, except for the package substrate.

The package substrate 11d of the LED package 10d includes a metal substrate 12a made of aluminum or copper, and an insulating circuit board 12b bonded onto the upper surface of the metal substrate 12a. The circuit board 12b has openings at the same positions where the mounting regions 11R, 11G and 11B of the LED package 10 are placed. The LED devices 13 are mounted on the upper surface of the metal substrate 12a exposed in the openings. The conductive patterns and electrode terminals of the package substrate 11d are provided on the upper surface of the circuit board 12b, and the top view of the package substrate 11d is the same as that shown in FIG. 5A. Each LED package may include a substrate, such as the package substrate 11d, obtained by bonding a metal substrate and a circuit board together, instead of the package substrate 11. This allows the LED devices 13 to be directly mounted on the metal substrate 12a excelling in heat dissipation, which improves the heat dissipation characteristics of the LED package.

The conductive patterns and electrode terminals on the package substrate 11 will be described below. The conductive patterns 22R, 23R, 22G, 23G, 22B and 23B are current-carrying paths provided on the upper surface of the package substrate 11 so as not to overlap each other. The conductive patterns 22R and 23R electrically connect the LED devices 13 of the light-emitting region 15R and the electrode terminals 24R and 25R. The conductive patterns 22G and 23G electrically connect the LED devices 13 of the light-emitting region 15G and the electrode terminals 24G and 25G. The conductive patterns 22B and 23B electrically connect the LED devices 13 of the light-emitting region 15B and the electrode terminals 24B and 25B.

As shown in FIG. 5A, the conductive pattern 22R extends straight between the mounting regions 11R and 11G and between the mounting regions 11R and 11B, and curvedly along the circular arc of the mounting region 11R, and also extends toward an outer edge of the package substrate 11. The conductive pattern 23R extends straight between the mounting regions 11R and 11G, and curvedly along the circular arc of the mounting region 11R, and also extends toward the outer edge of the package substrate 11. Outside the dam member 14, the conductive patterns 22R and 23R further extend along a circle centered at the center of the dam member 14, so as to surround the mounting regions 11R, 11G and 11B. The shapes of the conductive patterns 22G and 23G and the conductive patterns 22B and 23B are similar to those of the conductive patterns 22R and 23R.

In other words, each of the conductive patterns 22R, 23R, 22G, 23G, 22B and 23B includes a first segment extending under one of the straight-line segments of the dam member 14 from a space between the light-emitting regions 15R, 15G and 15B to an outer edge of the package substrate 11, and a second segment extending around the outer circumferences of the light-emitting regions 15R, 15G and 15B outside the dam member 14. Providing some of each conductive pattern under the dam member 14 allows the conductive patterns to be arranged on the package substrate 11 without narrowing the mounting regions 11R, 11G and 11B. Outside the light-emitting regions 15R, 15G and 15B, the conductive patterns 22G, 23G, 22R, 23R, 22B and 23B are concentrically arranged in this order from the central to outer sides around the center of the light-emitting regions.

The electrode terminals 24R and 25R, the electrode terminals 24G and 25G and the electrode terminals 24B and 25B correspond to the cathodes and anodes of the light-emitting regions 15R, 15G and 15B. In the package substrate 11, these electrode terminals 24R, 25R, 24G, 25G, 24B and 25B are triply provided. In other words, three sets of electrode terminals are arranged in the LED package 10, if the six electrode terminals 24R, 25R, 24G, 25G, 24B and 25B corresponding to the cathodes and anodes of the three light-emitting regions 15R, 15G and 15B are defined as one set of electrode terminals. The degree of redundancy of the sets of electrode terminals in the LED package 10 is three, which is the same as the number of colors of light (red, green and blue) emitted from the LED package 10.

The electrode terminals 24R, 25R, 24G, 25G, 24B and 25B are arranged outside the dam member 14 on the circular arcs of the conductive patterns 22R, 23R, 22G, 23G, 22B and 23B, respectively. Further, the six electrode terminals of each set are arranged on the same straight line passing through the center of the light-emitting regions 15R, 15G and 15B. More specifically, on one side of the dam member 14, the electrode terminals 25B, 25R and 25G are arranged in this order toward the center of the package substrate 11, while on the opposite side across the dam member 14, the electrode terminals 24B, 24R and 24G are arranged in this order toward the center of the package substrate 11.

Further, the three sets of electrode terminals 24R, 25R, 24G, 25G, 24B and 25B are arranged on the package substrate 11 at intervals of 120° around the light-emitting regions 15R, 15G and 15B so as to be rotationally symmetric. In other words, the three sets of electrode terminals 24R, 25R, 24G, 25G, 24B and 25B are arranged at intervals of an integer multiple of 360°/n around the center of the light-emitting regions 15R, 15G and 15B, where n represents the number of light-emitting regions in each LED package 10 (i.e., n=3). The angular distance between three electrode terminals 24B, 24R and 24G and three electrode terminals 25B, 25R and 25G which adjoin each other in the circumferential direction is 60°.

Each LED package 10 is connected to the mother board 5, with one of the three sets of electrode terminals 24R, 25R, 24G, 25G, 24B and 25B soldered to the electrode terminals 52R, 53R, 52G, 53G, 52B and 53B. In the light-emitting apparatus 1, the arrangement angles of the twenty-two LED packages 10 in the upper surface of the mother board 5 are therefore different from each other as shown in FIG. 3, depending on which set of electrode terminals of each LED package 10 is connected to the electrode terminals 52R, 53R, 52G, 53G, 52B and 53B. In FIG. 3, for example, the light-emitting regions 15R, 15G and 15B of the LED package $10_2$ on the right of the LED package $10_1$ are rotated by +120° (anticlockwise by 120°) with respect to those of the LED package $10_1$. The light-emitting regions 15R, 15G and 15B on the left of the LED package $10_1$ are rotated by −120° (clockwise by 120°) with respect to those of the LED package $10_1$.

Since the same applies for the other LED packages 10, in the light-emitting apparatus 1, the arrangement angles of the light-emitting regions 15R, 15G and 15B of the LED packages 10 in the upper surface of the mother board 5 differ from each other by 120°. The arrangement angles of the light-emitting regions 15R, 15G and 15B of the LED packages 10 with respect to the LED package $10_1$ are 0°, 120° or 240°. In other words, the arrangement angles of the LED packages 10 with respect to a reference direction in the upper surface of the mother board 5 (e.g., one side of the mother board 5) differ by an integer multiple of 360°/n, where n represents the number of light-emitting regions in each LED package 10 (i.e., n=3).

These different arrangement angles of the LED packages 10 in the light-emitting apparatus 1 allow the light beams of different colors to mix favorably on an irradiated surface, when the light-emitting regions of every LED package 10 emit light at the same time, compared with the case where all of the LED packages 10 have the same arrangement angle with respect to a reference direction. In order to realize such an arrangement, it is only necessary for the mother board 5 of the light-emitting apparatus 1 to include a set of electrode terminals 52R, 53R, 52G, 53G, 52B and 53B arrayed on the same straight line for every LED package 10, as shown in FIG. 2A. In the light-emitting apparatus 1, the LED packages 10 can be easily arranged so that color mixing is improved, by appropriately rotating and mounting the same LED packages 10 on the mother board 5 where the electrode terminals are uniformly provided.

Figure 6A:
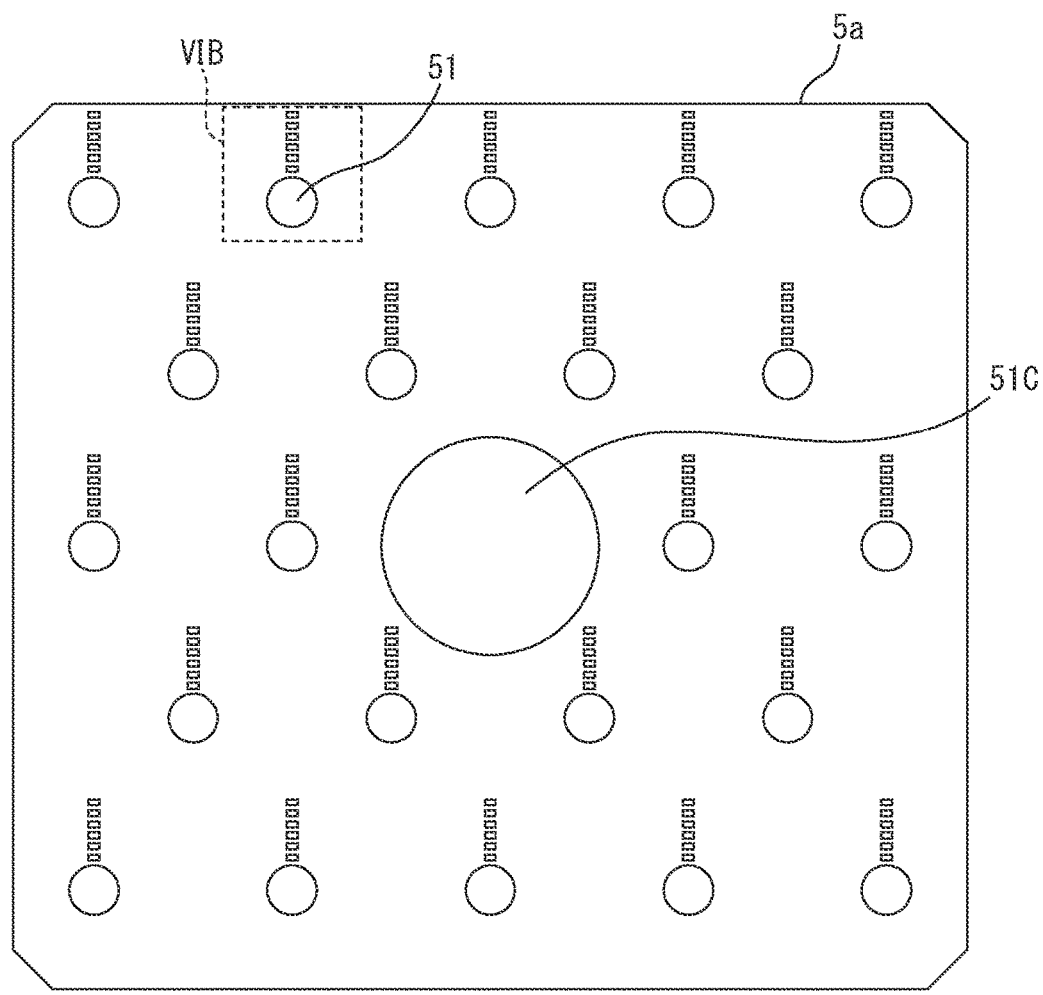
FIG. 6A is a bottom view of another mother board 5a, and FIG. 6B is an enlarged view of the area indicated by the broken line VIB of FIG. 6A.
Figure 6B:
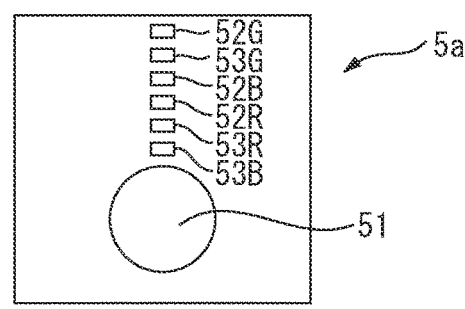
Figure 7A:
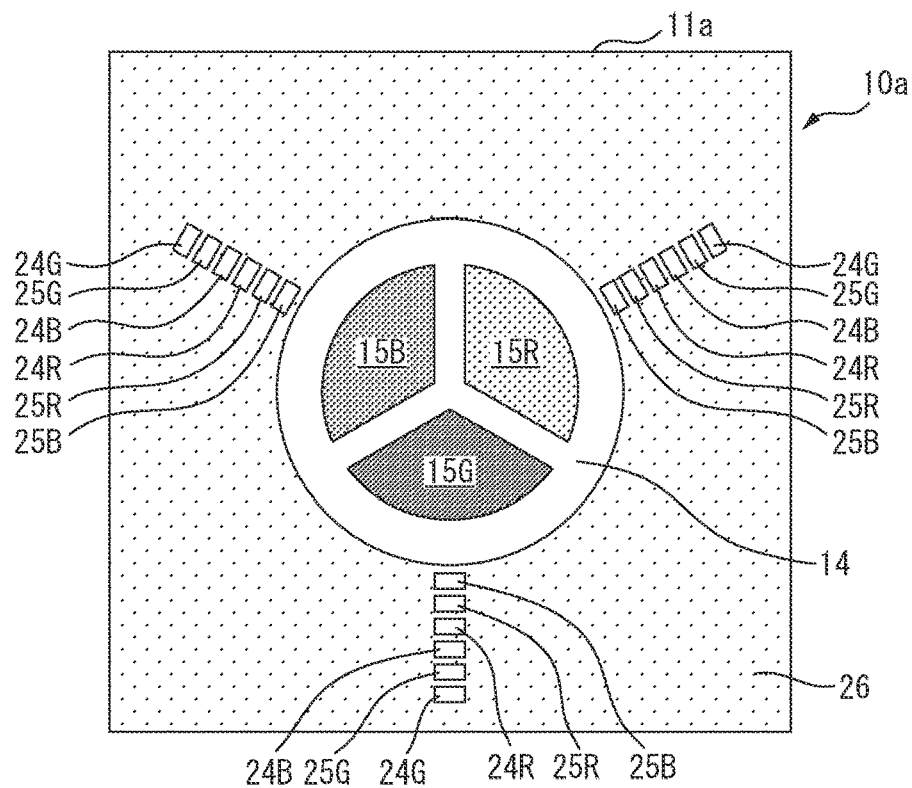
Figure 7B:
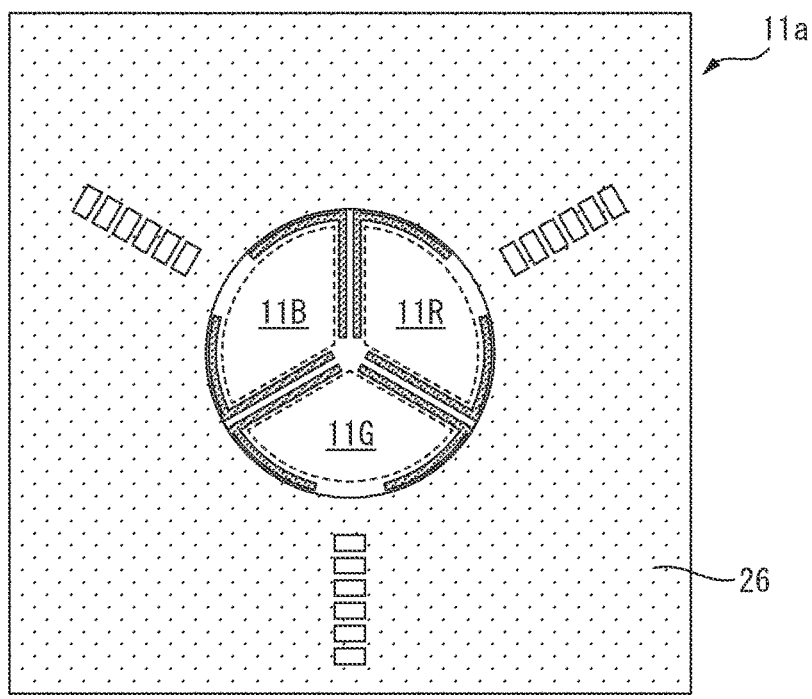

FIG. 6A is a bottom view of another mother board 5a, and FIG. 6B is an enlarged view of the area indicated by the broken line VIB of FIG. 6A. FIGS. 7A and 7B are top views of an LED package 10a. FIG. 7B shows the package substrate 11a of the LED package 10a having a white resist 26 formed on the upper surface thereof. The mother board 5 and each LED package 10 in the light-emitting apparatus 1 may be replaced with the mother board 5a in FIG. 6A and the LED package 10a in FIG. 7A, respectively.

The mother board 5a is identical in structure to the mother board 5, except for the positions of the electrode terminals. As shown in FIG. 6B, on the lower surface around each of the openings 51, the mother board 5a includes a set of electrode terminals 52R, 53R, 52G, 53G, 52B and 53B corresponding to the cathodes and anodes of the red, green and blue light-emitting regions of the LED package 10a. However, in the mother board 5a, the electrode terminals 52G, 53G, 52B, 52R, 53R and 53B are arranged in a straight line on only one side of each opening 51 in this order toward the opening 51.

The LED package 10a is identical in structure to the LED package 10, except for the shapes of the conductive patterns and the positions of the electrode terminals. As shown in FIG. 7A, the LED package 10a also includes three sets of the electrode terminals 24R, 25R, 24G, 25G, 24B and 25B. The electrode terminals of each set are arranged outside the dam member 14 on the same straight line passing through the center of the light-emitting regions 15R, 15G and 15B. However, in the LED package 10a, the electrode terminals 24G, 25G, 24B, 24R, 25R and 25B of each set are arranged on only one side of the dam member 14 in this order toward the center of the package substrate 11a, similarly to the electrode terminals 52R, 53R, 52G, 53G, 52B and 53B of the mother board 5a.

The three sets of electrode terminals 24R, 25R, 24G, 25G, 24B and 25B of the LED package 10a are also arranged on the package substrate 11a at intervals of 120° around the light-emitting regions 15R, 15G and 15B so as to be rotationally symmetric. In the LED package 10a, the angular distance between two sets of the six electrode terminals 24R, 25R, 24G, 25G, 24B and 25B which adjoin each other in the circumferential direction is 120°.

Figure 8:
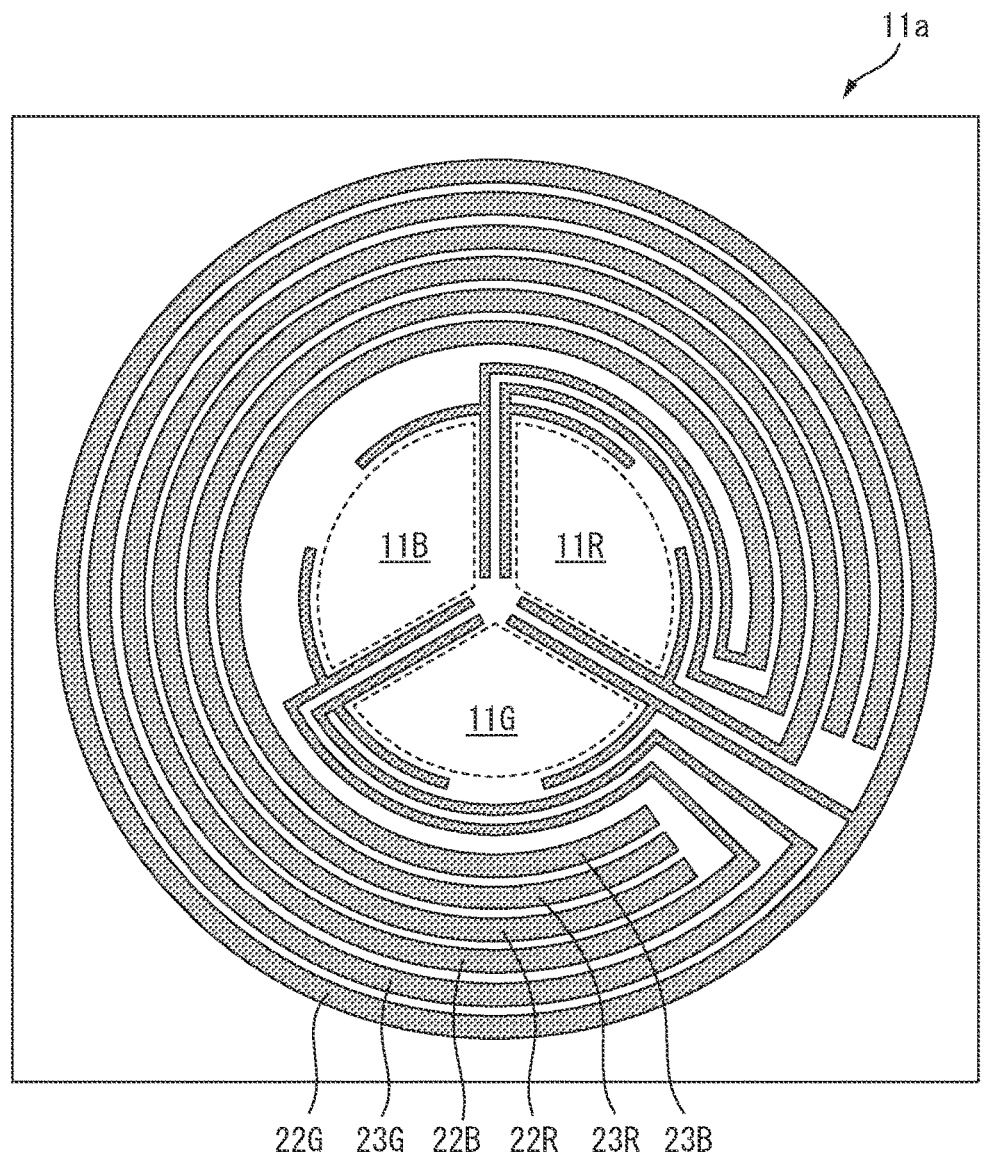

FIG. 8 is a top view of the package substrate 11a of the LED package 10a. The shapes of the conductive patterns 22R, 23R, 22G, 23G, 22B and 23B of the package substrate 11a are similar to those of the package substrate 11. The conductive patterns 23B, 23R, 22R, 22B, 23G and 22G are arranged outside the light-emitting regions 15R, 15G and 15B in this order from the center to the outer edges of the package substrate 11a. In the package substrate 11a, three positions on each circular arc of the conductive patterns 22R, 23R, 22G, 23G, 22B and 23B are exposed without being covered by the white resist 26. These eighteen positions in total correspond to the three sets of electrode terminals 24R, 25R, 24G, 25G, 24B and 25B.

Figure 9:
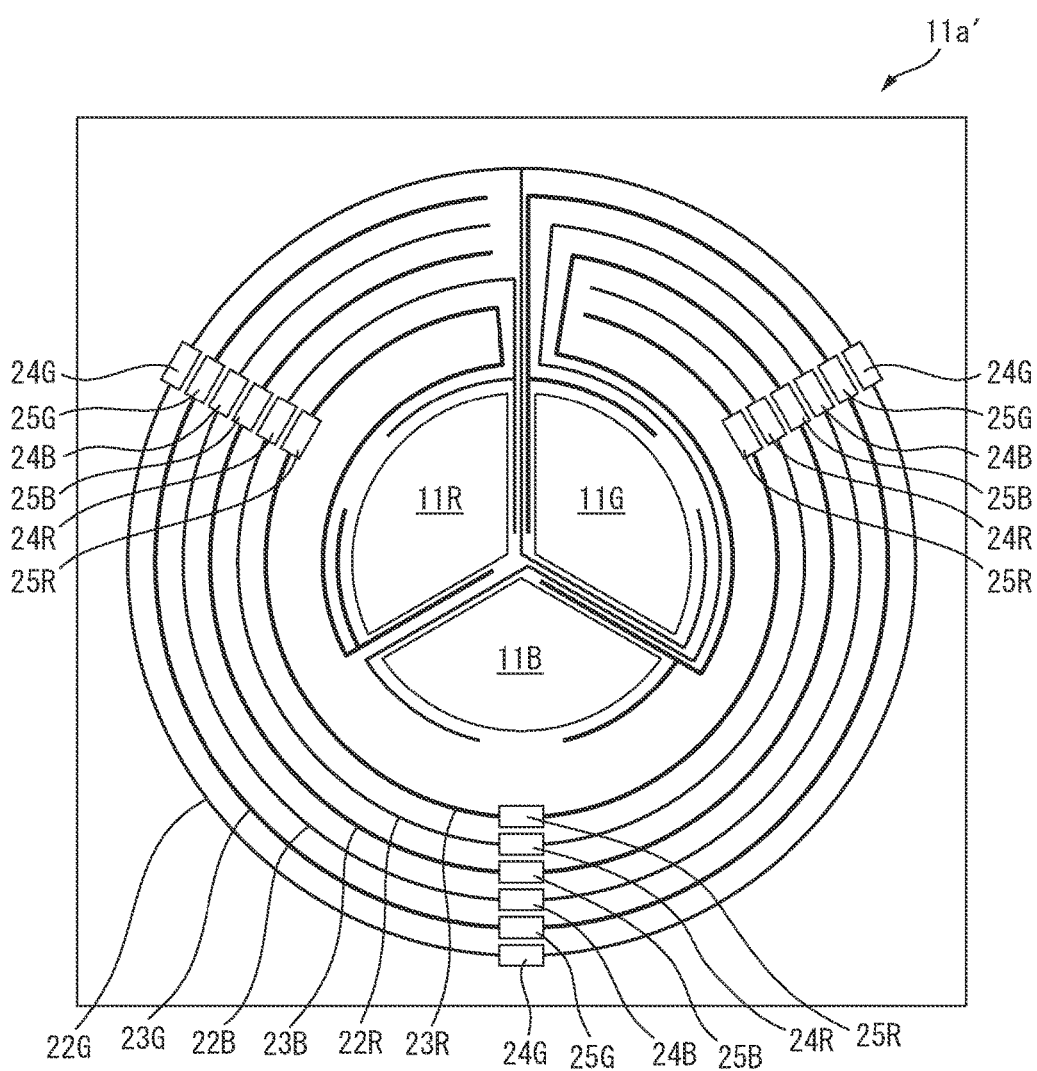

FIG. 9 is a top view of another package substrate 11a' for the LED package 10a. The arrangement of the conductive patterns 22R, 23R, 22G, 23G, 22B and 23B of the LED package 10a is not limited to the one shown in FIG. 8, but may be as shown in FIG. 9. The conductive patterns 23R, 22R, 23B, 22B, 23G and 22G are arranged outside the light-emitting regions 15R, 15G and 15B in this order from the center to the outer edges of the package substrate 11a. In the package substrate 11a', the electrode terminals 24R, 25R, 24G, 25G, 24B and 25B of each set are arranged on the circular arcs of the conductive patterns 22R, 23R, 22G, 23G, 22B and 23B, respectively; and the three sets of electrode terminals are arranged at three positions on these circular arcs.

Figure 10A:
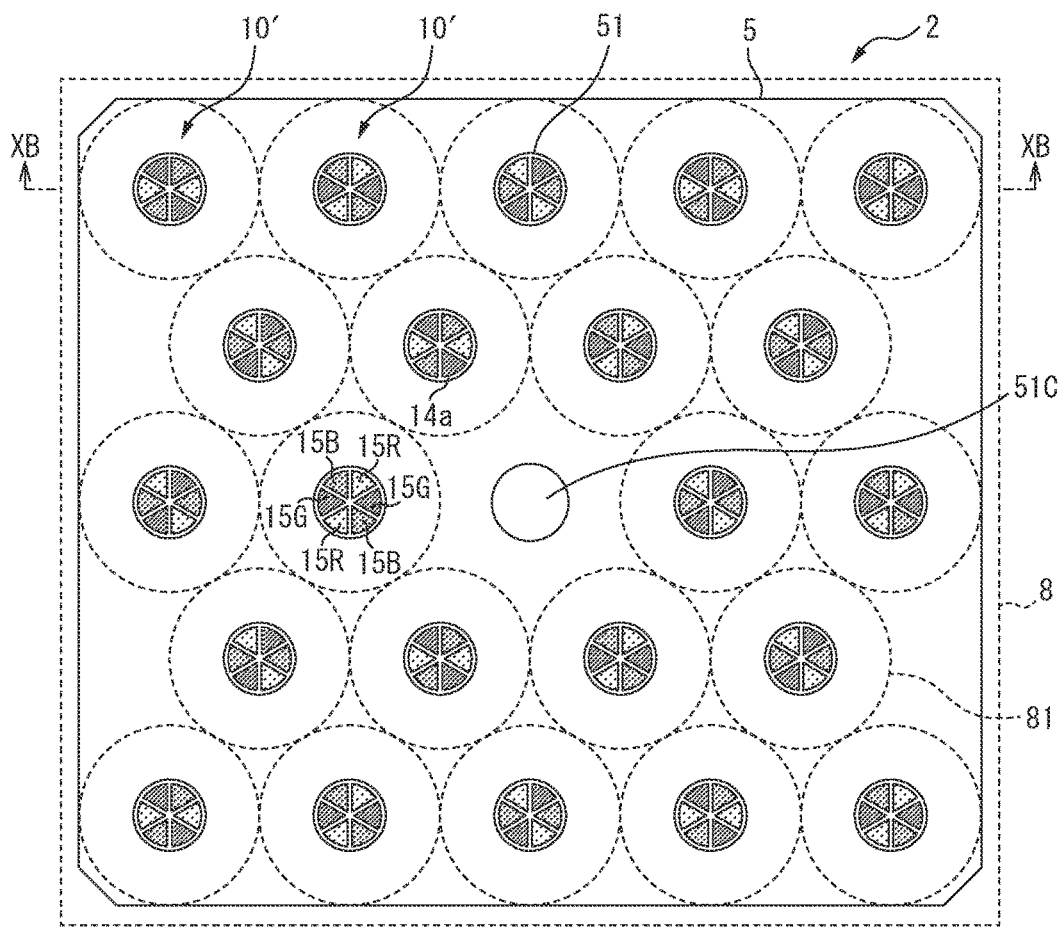
FIG. 10A is a top view of another light-emitting apparatus 2.
Figure 10B:
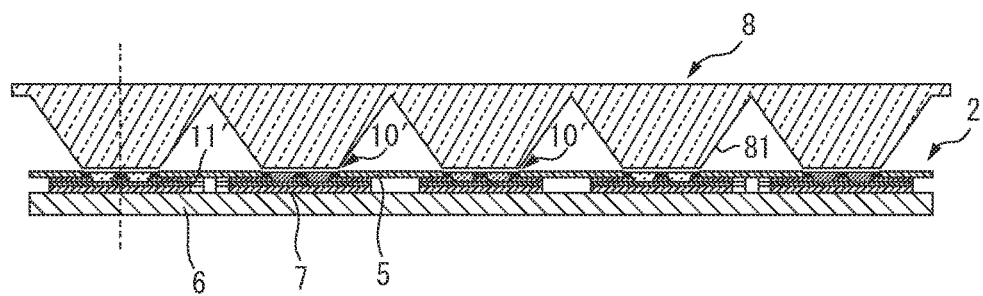
FIG. 10B is a cross-sectional view of the light-emitting apparatus 2 taken along the line XB-XB of FIG. 10A.

FIG. 10A is a top view of another light-emitting apparatus 2, and FIG. 10B is a cross-sectional view of the light-emitting apparatus 2 taken along the line XB-XB of FIG. 10A. The light-emitting apparatus 2 is identical in structure to the light-emitting apparatus 1, except for the LED packages.

Figure 11A:
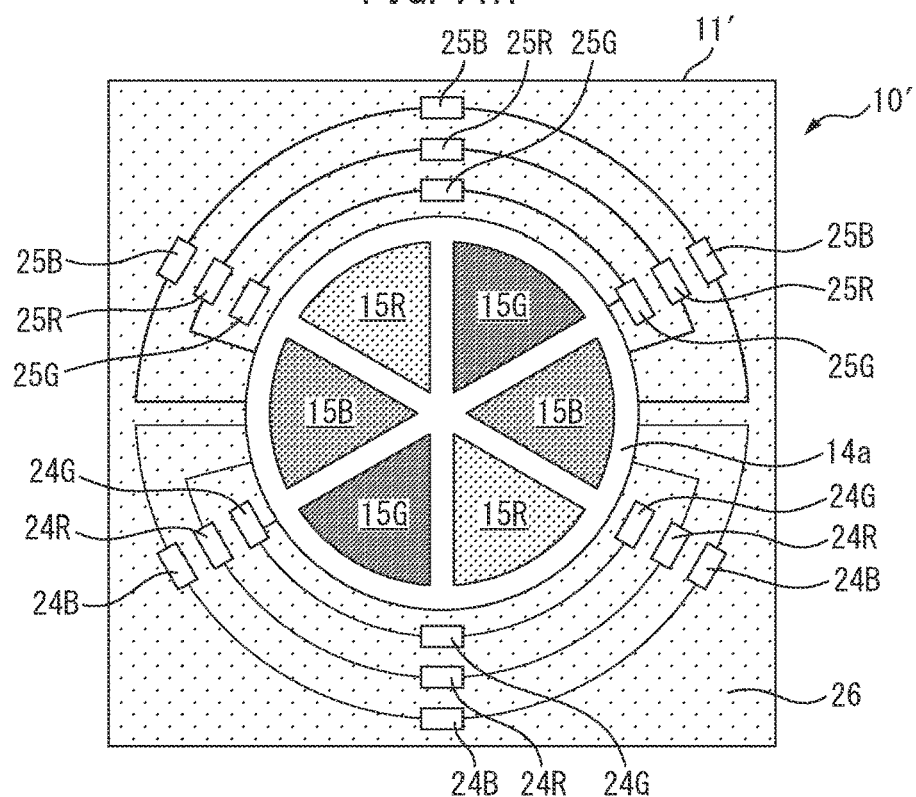
FIGS. 11A and 11B are top views of an LED package 10' of the light-emitting apparatus 2.
Figure 11B:
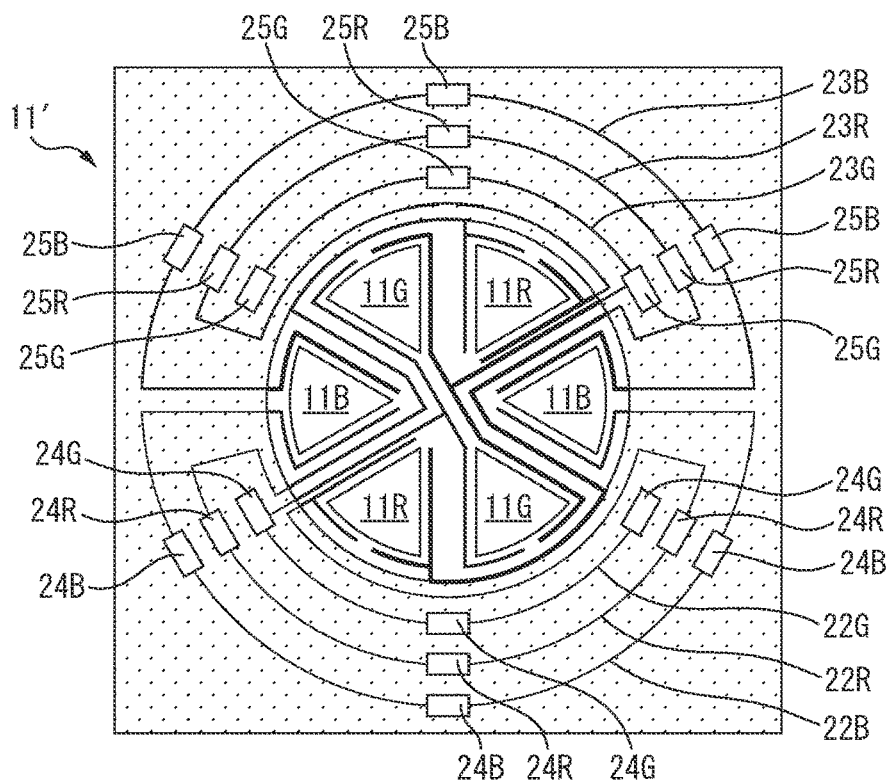

FIGS. 11A and 11B are top views of an LED package 10' of the light-emitting apparatus 2. FIG. 11B shows the package substrate 11' of the LED package 10'. The LED package 10' is identical in structure to the LED package 10, except for the shapes of the conductive patterns and dam member, the positions of the electrode terminals, and the number of light-emitting regions.

The number of light-emitting regions of the LED package 10' is six, and thus the dam member 14a of the LED package 10' includes a circular segment and six straight-line segments which extend radially from the center of the circle and divide the circle into six equal parts. The light-emitting regions are surrounded by the dam member 14a, and each have a fan shape with a central angle of 60°. Each pair of the fan-shaped regions facing each other with the center of the dam member 14a sandwiched therebetween corresponds to the light-emitting regions emitting light of the same color. In the LED package 10', the six light-emitting regions 15R, 15G, 15B, 15R, 15G and 15B are arranged in this order in a clockwise direction. As in the LED package 10', it is not necessary for all of the light-emitting regions to emit light of different colors, but some of the light-emitting regions may emit light of the same color. In other words, it is sufficient for at least some of the light-emitting regions and the other light-emitting regions to emit light of different colors.

The shapes of the conductive patterns 22R, 23R, 22G, 23G, 22B and 23B of the package substrate 11' are similar to those of the package substrate 11. However, the conductive patterns 22R, 22G and 22B extend from the perimeters of the two mounting regions 11R, the two mounting regions 11G and the two mounting regions 11B to outer edges of the package substrate 11', respectively, and further extend along circular arcs outside the dam member 14a in the lower half of the package substrate 11' in FIG. 11B. The conductive patterns 23R, 23G and 23B are point-symmetric to the conductive patterns 22R, 22G and 22B with respect to the center of the dam member 14a, and extend along circular arcs outside the dam member 14a in the upper half of the package substrate 11' in FIG. 11B.

The package substrate 11' includes three sets of electrode terminals 24R, 25R, 24G, 25G, 24B and 25B. The electrode terminals 24R, 24G and 24B of each set are arranged on the respective conductive patterns 22R, 22G and 22B in the lower half of the package substrate 11'. Similarly, the electrode terminals 25R, 25G and 25B of each set are arranged on the respective conductive patterns 23R, 23G and 23B in the upper half of the package substrate 11'. In the package substrate 11', the LED devices 13 of the two light-emitting regions 15R, the two light-emitting regions 15G and the two light-emitting regions 15B are connected between the electrode terminals 24R and 25R, between the electrode terminals 24G and 25G, and between the electrode terminals 24B and 25B, respectively. As the LED package 10', it is not necessary for all of the light-emitting regions to be capable of emitting light independently of each other, but the LED devices 13 in some of the light-emitting regions may be connected to the same electrode terminals.

The degree of redundancy of the sets of electrode terminals in the LED package 10' is also three, which is the same as the number of colors of light (red, green and blue) emitted from the LED package 10'. The number of light-emitting regions in the LED package 10' is six, and the three sets of electrode terminals 24R, 25R, 24G, 25G, 24B and 25B are arranged at intervals of an integer multiple of 360°/6=60° around the center of the light-emitting regions 15R, 15G and 15B.

Figure 12:
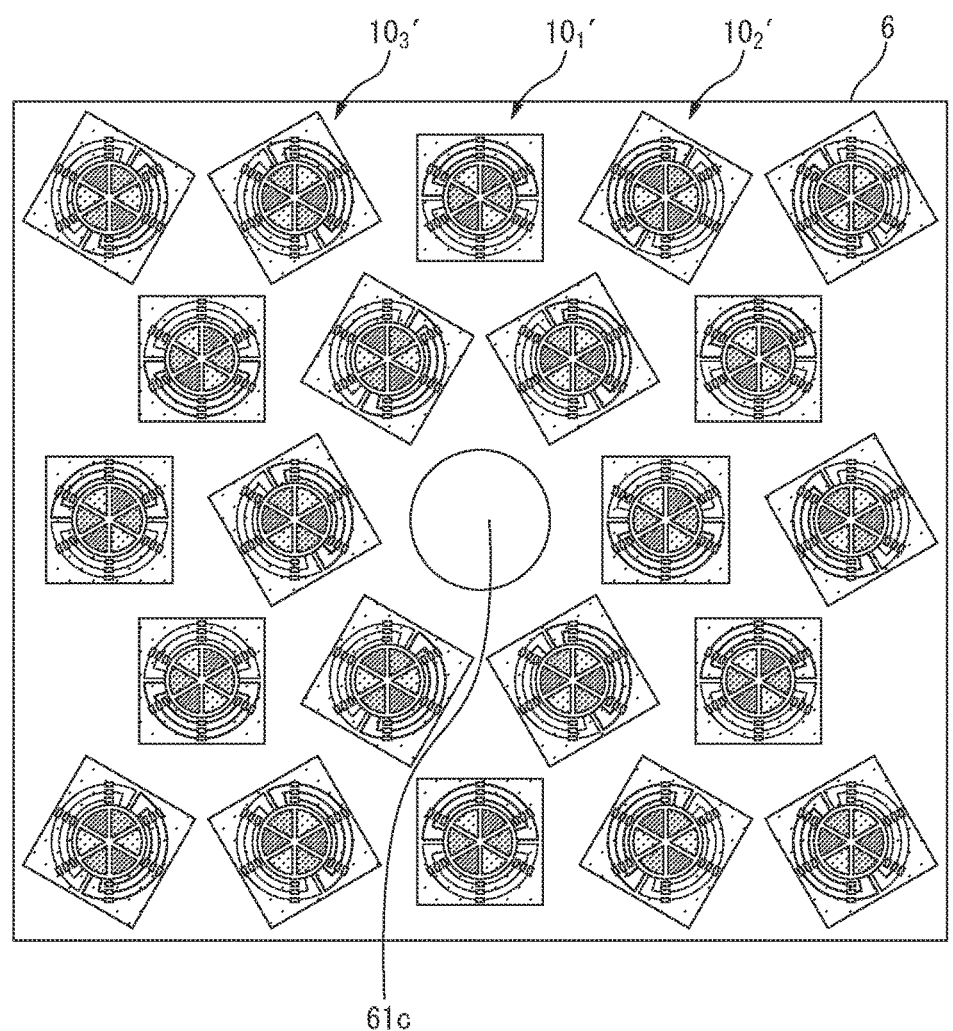
FIG. 12 is a top view showing the heat sinking substrate 6 and an arrangement of the LED packages 10'.

FIG. 12 is a top view showing the heat sinking substrate 6 and an arrangement of the LED packages 10'. In the light-emitting apparatus 2 of FIG. 12, for example, the light-emitting regions of the LED package $10_2$' on the right of the LED package $10_1$' are rotated by +60° with respect to those of the LED package $10_1$'. The light-emitting regions of the LED package $10_3$' on the left of the LED package $10_1$' are rotated by −60° with respect to those of the LED package $10_1$'. Since the same applies for the other LED packages 10', in the light-emitting apparatus 2, the arrangement angles of the light-emitting regions of the LED packages 10' in the upper surface of the mother board 5 differ from each other by 60°. In other words, the arrangement angles of the LED packages 10' with respect to a reference direction in the upper surface of the mother board 5 (e.g., one side of the mother board 5) differ by an integer multiple of 360°/n, where n represents the number of light-emitting regions in each LED package 10' (i.e., n=6).

This arrangement of the LED packages 10' of the light-emitting apparatus 2 also allows the light beams of different colors to mix favorably on an irradiated surface, similarly to the light-emitting apparatus 1, when the light-emitting regions of every LED package 10' emit light at the same time. In the light-emitting apparatus 2, such an arrangement can be easily realized by appropriately rotating and mounting the same LED packages 10' on the mother board 5 where the electrode terminals are uniformly provided.

FIG. 13A is a top view of another light-emitting apparatus 3. The light-emitting apparatus 3 is identical in structure to the light-emitting apparatus 1, except for the LED packages and the presence or absence of the central openings of the mother board and heat sinking substrate. In FIG. 13A, the lens array 8 is omitted from illustration.

The light-emitting apparatus 3 includes LED packages 10b, each including a package substrate 11b, LED devices 13, a dam member 14b and four light-emitting regions 15R, 15B, 15G and 15C. The dam member 14b includes a circular segment and four straight-line segments which extend radially from the center of the circle and divide the circle into four equal parts. The four fan-shaped regions which are surrounded by the dam member 14b and each have a central angle of 90° correspond to the light-emitting regions 15R, 15G, 15B and 15C. In the illustrated example, the four light-emitting regions 15R, 15B, 15G and 15C are arranged in this order in a clockwise direction.

Of these four regions, the light-emitting regions 15R, 15G and 15B emit red, green and blue light, respectively, similarly to those described above. The light-emitting region 15C is composed of LED devices 13 and a sealing resin 15C sealing the LED devices 13, and emits cyan light. The sealing resin 15C contains a phosphor, such as $Ba_2MgSi_2O_7$:$Eu^{2+}$ or $BaSi_2O_2N_2$:$Eu^{2+}$, which absorbs the blue light from the LED devices 13 to emit cyan light. Since cyan is generated by subtracting R from the primary colors of light RGB (i.e., C=G+B), the emission wavelength range of the light-emitting region 15C has a peak in the range of about 480 to 520 nm, for example, between blue and green.

The color of light emitted from the fourth light-emitting region 15C in each LED package 10b is not limited to cyan, but may be another color, such as yellow or amber. If the light-emitting region 15C emits yellow light, the sealing resin 15C contains a yellow phosphor, such as yttrium aluminum garnet (YAG), which absorbs the blue light from the LED devices 13 to emit yellow light. If the light-emitting region 15C emits amber light, the sealing resin 15C may contain yellow and red phosphors, for example, or a single phosphor which absorbs the blue light from the LED devices 13 to emit amber light.

FIGS. 13B and 13C are partial enlarged views of mother boards 5b and 5b' for the light-emitting apparatus 3. The mother boards 5b and 5b' are identical in structure to the mother board 5, except that the mother boards 5b and 5b' further include electrode terminals (mother-board electrodes) 52C and 53C corresponding to the fourth light-emitting region 15C of the LED package 10b. Similarly to the mother board 5 or 5a, each set of eight electrode terminals 52R, 53R, 52G, 53G, 52B, 53B, 52C and 53C of the light-emitting apparatus 3 may be separated into groups of four on both sides of the corresponding opening 51 as in the mother board 5b of FIG. 13B, or placed on one side of the opening 51 as in the mother board 5b' of FIG. 13C.

Figure 14:
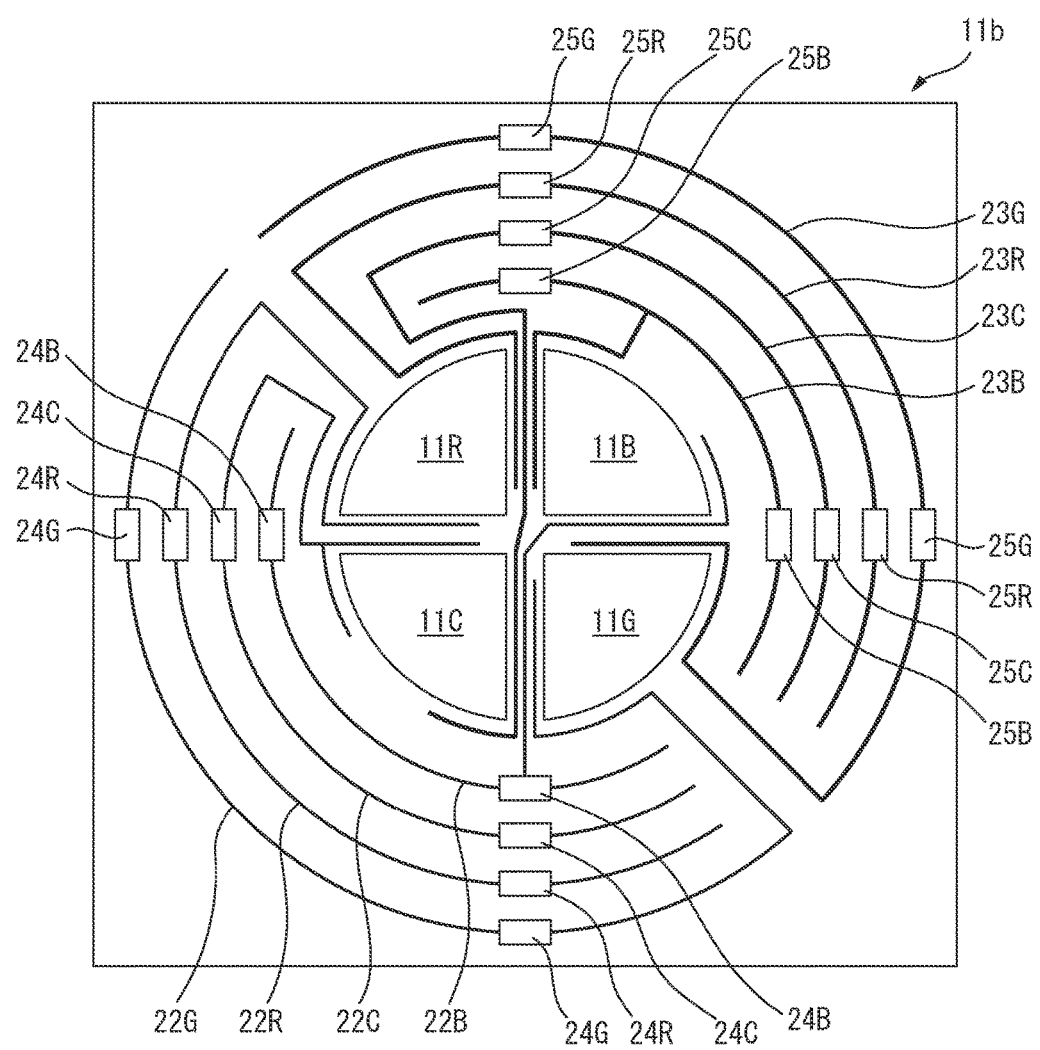
FIG. 14 is a top view of the package substrate 11b of the LED package 10b.

FIG. 14 is a top view of the package substrate 11b of the LED package 10b. The package substrate 11b includes conductive patterns 22R, 23R, 22G, 23G, 22B, 23B, 22C and 23C and two sets of electrode terminals (package electrodes) 24R, 25R, 24G, 25G, 24B, 25B, 24C and 25C, which can be connected to the electrode terminals of the mother board 5b in FIG. 13B. Reference numerals 11R, 11G, 11B and 11C indicate mounting regions of the LED devices 13 corresponding to the light-emitting regions 15R, 15G, 15B and 15C, respectively. The conductive patterns 22R, 22G, 22B and 22C extend from the perimeters of the respective mounting regions 11R, 11G, 11B and 11C to outer edges of the package substrate 11b, and further extend along circular arcs in the lower-left half of the package substrate 11b in FIG. 14.

The conductive patterns 23R, 23G, 23B and 23C similarly extend along circular arcs in the upper-right half of the package substrate 11b in FIG. 14.

The electrode terminals 24R, 24G, 24B and 24C of each set are arranged on the circular arcs of the respective conductive patterns 22R, 22G, 22B and 22C. The electrode terminals 25R, 25G, 25B and 25C of each set are arranged on the circular arcs of the respective conductive patterns 23R, 23G, 23B and 23C on the side opposite to the electrode terminals 24R, 24G, 24B and 24C with respect to the mounting regions 11R, 11G, 11B and 11C. The two sets of electrode terminals 24R, 25R, 24G, 25G, 24B, 25B, 24C and 25C are arranged at intervals of 90° so as to be rotationally symmetric. The electrode terminals of each set are arranged on the same straight line passing through the center of the mounting regions 11R, 11G, 11B and 11C.

Figure 15:
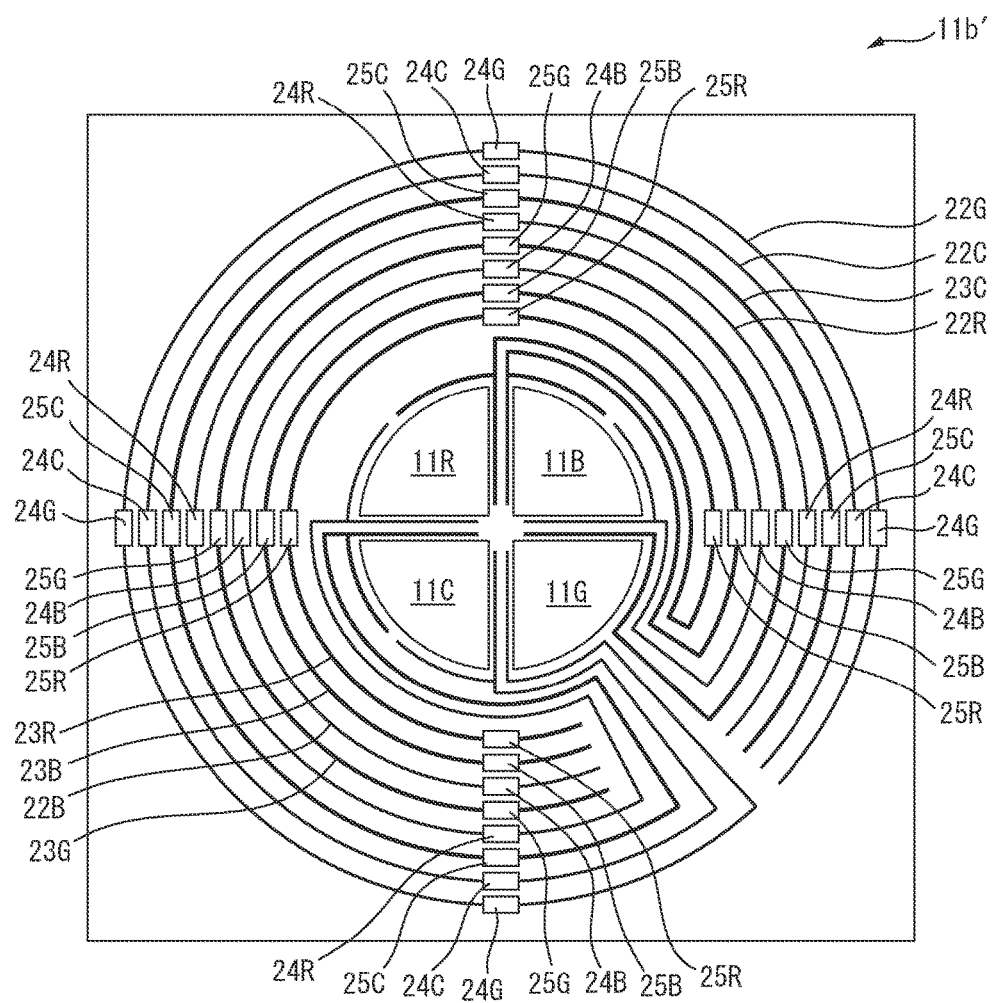
FIG. 15 is a top view of another package substrate 11b' for the LED package 10b.

FIG. 15 is a top view of another package substrate 11b' for the LED package 10b. The package substrate 11b' includes conductive patterns 22R, 23R, 22G, 23G, 22B, 23B, 22C and 23C and four sets of electrode terminals 24R, 25R, 24G, 25G, 24B, 25B, 24C and 25C, which can be connected to the electrode terminals of the mother board 5b' in FIG. 13C. The conductive patterns 23R, 23B, 22B, 23G, 22R, 23C, 22C and 22G are arranged outside the mounting regions 11R, 11G, 11B and 11C in this order from the center to the outer edges of the package substrate 11b', so as to form eight concentric circles. The four sets of electrode terminals are arranged at intervals of 90° so as to be rotationally symmetric. The electrode terminals 24R, 25R, 24G, 25G, 24B, 25B, 24C and 25C of each set are arranged on the same straight line and on the circular arcs of the respective conductive patterns 22R, 23R, 22G, 23G, 22B, 23B, 22C and 23C.

The degree of redundancy of the sets of electrode terminals in the LED package 10b including the package substrate 11b' is four, which is the same as the number of colors of light (red, green, blue and cyan) emitted from the LED package 10b. The number of light-emitting regions in the LED package 10b is four, and the four sets of electrode terminals 24R, 25R, 24G, 25G, 24B, 25B, 24C and 25C are arranged at intervals of an integer multiple of 360°/4=90° around the center of the light-emitting regions 15R, 15G, 15B and 15C.

In the light-emitting apparatus 3 of FIG. 13A, for example, the light-emitting regions of the LED package $10b_2$ on the left of the LED package $10b_1$ are rotated by +90° with respect to those of the LED package $10b_1$. The light-emitting regions of the LED package $10b_3$ on the right of the LED package $10b_1$ are rotated by −90° with respect to those of the LED package $10b_1$. In other words, the arrangement angles of the LED packages 10b with respect to a reference direction in the upper surface of the mother board 5b (e.g., one side of the mother board 5b) differ by an integer multiple of 360°/n, where n represents the number of light-emitting regions in each LED package 10b (i.e., n=4). Similarly to the light-emitting apparatus 1, the light-emitting apparatus 3 can be easily produced from the mother board 5b and the same LED packages 10b, and the light beams of different colors can be mixed favorably on an irradiated surface, when the light-emitting regions of every LED package 10b emit light at the same time.

Figure 16A:
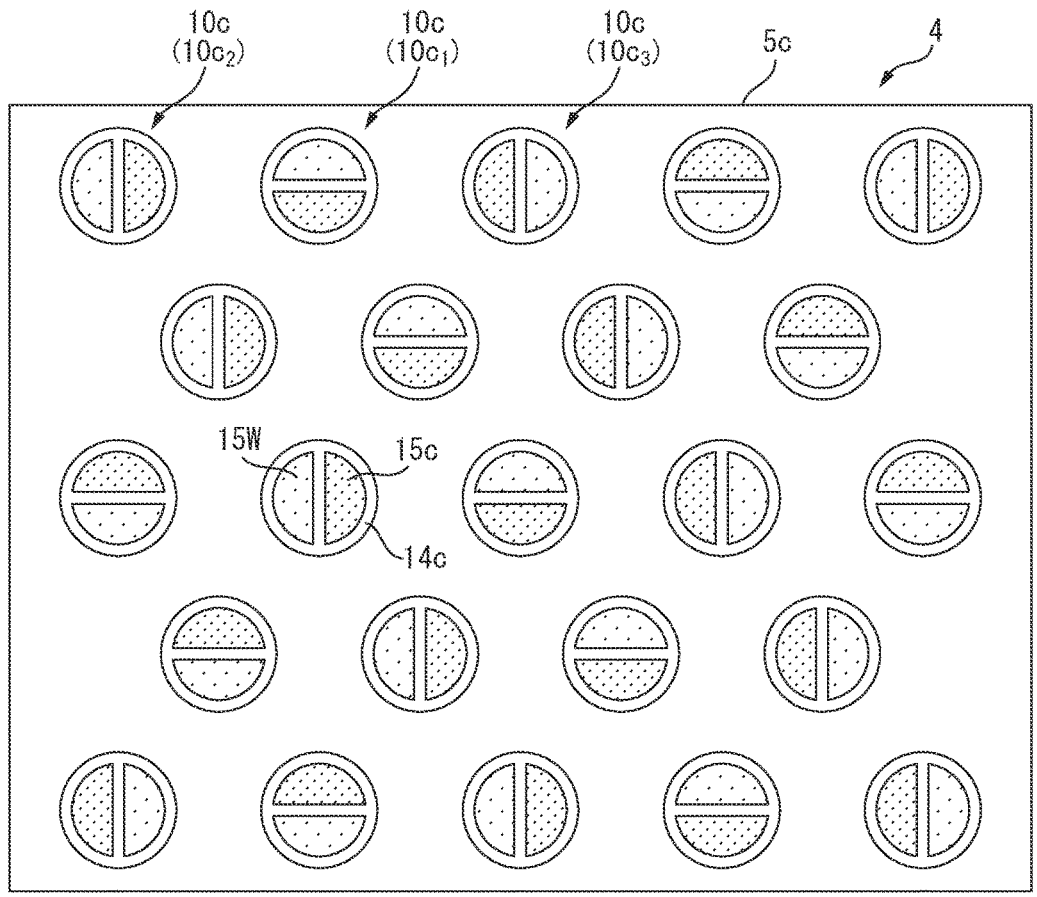
FIG. 16A is a top view of another light-emitting apparatus 4.

FIG. 16A is a top view of another light-emitting apparatus 4. The light-emitting apparatus 4 is identical in structure to the light-emitting apparatus 1, except for the LED packages and the presence or absence of the central openings of the mother board and heat sinking substrate. In FIG. 16A, the lens array 8 is omitted from illustration.

The light-emitting apparatus 4 includes LED packages 10c, each including a package substrate 11c, LED devices 13, a dam member 14c and two light-emitting regions 15C and 15W. The dam member 14c includes a circular segment and a single straight-line segment which divides the circle into two equal parts. This straight-line segment corresponds to the diameter of the circle. The two fan-shaped regions which are surrounded by the dam member 14c and filled with a sealing resin (sealing resins 15C and 15W) and have a central angle of 180° correspond to the light-emitting regions 15C and 15W. The light-emitting regions 15C and 15W of the light-emitting apparatus 4 emit light of a cold color (e.g., color temperature of 6500 K) and a warm color (e.g., color temperature of 3500 K), respectively.

Figure 16B:
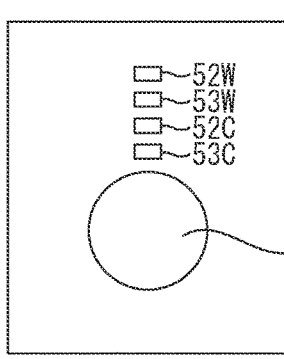
FIG. 16B is a partial enlarged view of the mother board 5c of the light-emitting apparatus 4.

FIG. 16B is a partial enlarged view of the mother board 5c of the light-emitting apparatus 4. The mother board 5c is identical in structure to the mother board 5, except for the number of electrode terminals. At each opening 51, the mother board 5c includes four electrode terminals (motherboard electrodes) 52C, 53C, 52W and 53W corresponding to electrode terminals of the light-emitting regions 15C and 15W. Each set of four electrode terminals of the mother board 5c may be placed on one side of the corresponding opening 51 as in FIG. 16B, or separated into groups of two on both sides of the opening 51 as in FIG. 2B.

Figure 16C:
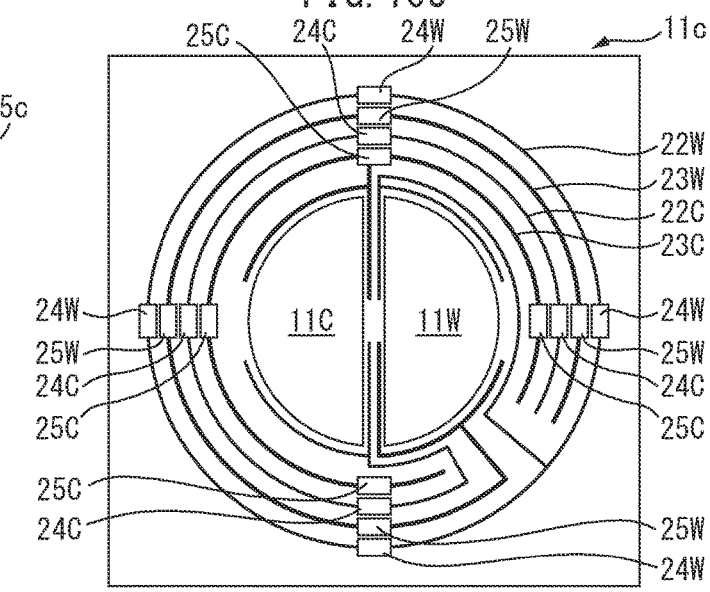
FIG. 16C is a top view of the package substrate 11c of the LED package 10c.

FIG. 16C is a top view of the package substrate 11c of the LED package 10c. The package substrate 11c includes conductive patterns 23C, 22C, 23W and 22W and four sets of electrode terminals (package electrodes) 24C, 25C, 24W and 25W. Reference numerals 11C and 11W indicate mounting regions of the LED devices 13 corresponding to the light-emitting regions 15C and 15W, respectively. The conductive patterns 23C, 22C, 23W and 22W are arranged outside the mounting regions 11C and 11W in this order from the center to the outer edges of the package substrate 11c, so as to form four concentric circles. The four sets of electrode terminals are arranged at intervals of 90° so as to be rotationally symmetric. The electrode terminals 24C, 25C, 24W and 25W of each set are arranged on the same straight line and on the circular arcs of the respective conductive patterns 22C, 23C, 22W and 23W.

Figure 17A:
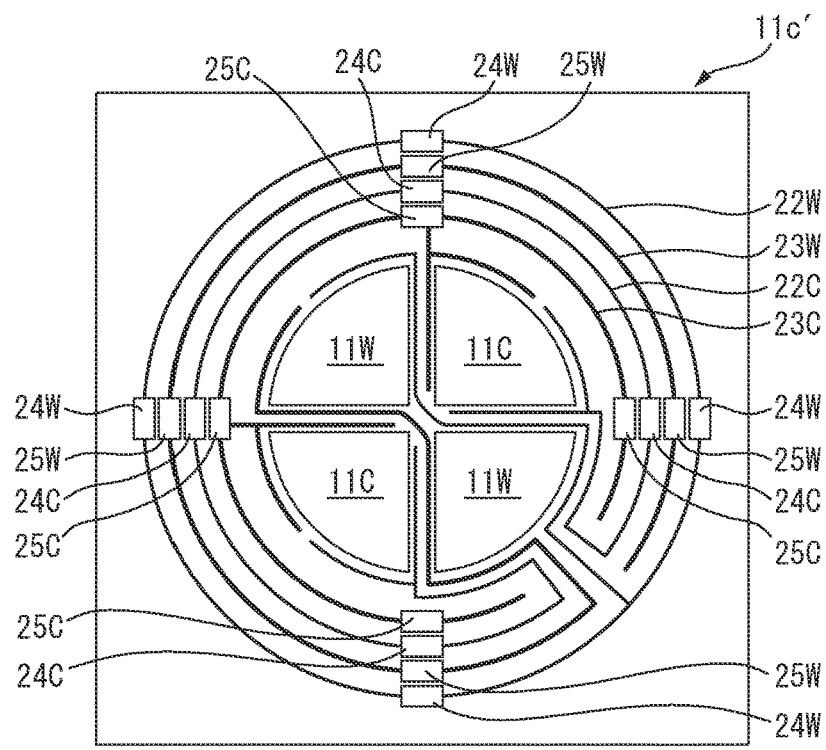
FIGS. 17A and 17B are top views of other package substrates 11c' and 11c" for the LED package 10c.
Figure 17B:
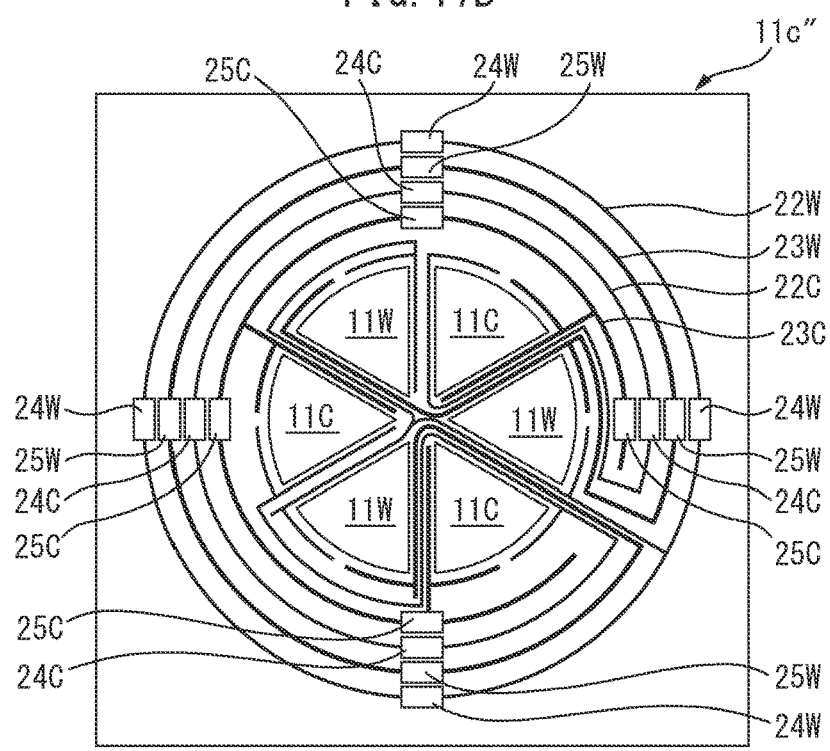

FIGS. 17A and 17B are top views of other package substrates 11c' and 11c" for the LED package 10c. The central circular region is divided into four fan-shaped regions (two mounting regions 11C and two mounting regions 11W) in the package substrate 11c', and into six fan-shaped regions (three mounting regions 11C and three mounting regions 11W) in the package substrate 11c". The mounting regions 11C and 11W correspond to light-emitting regions 15C and 15W of the LED package 10c, respectively. The shapes of the conductive patterns 22C, 23C, 22W and 23W and the arrangement of the electrode terminals 24C, 25C, 24W and 25W of the package substrates 11c' and 11c" are similar to those of the package substrate 11c.

The degrees of redundancy of the sets of electrode terminals in the LED packages 10c including the package substrates 11c, 11c' and 11c" are two, four and six, respectively, which are not less than the number of colors of light (cold and warm colors) emitted from the LED package 10c, i.e., two. The number of light-emitting regions in the LED package 10c including the package substrate 11c' is four, and the two sets of electrode terminals 24C, 25C, 24W and 25W are arranged at intervals of an integer multiple of 360°/4=90°.

In the light-emitting apparatus 4 of FIG. 16A, for example, the light-emitting regions of the LED package $10c_2$ on the left of the LED package $10c_1$ are rotated by +90° with respect to those of the LED package $10c_1$. The light-emitting regions of the LED package $10c_3$' on the right of the LED package $10c_1$ are rotated by −90° with respect to those of the LED package $10c_1$. Since the same applies for the other LED packages 10c, in the light-emitting apparatus 4, the arrangement angles of the light-emitting regions of the LED packages 10c in the upper surface of the mother board 5c differ from each other by 90°. Similarly to the light-emitting apparatus 1, the light-emitting apparatus 4 can be easily produced from the mother board 5c and the same LED packages 10c, and the light beams of different colors can be mixed favorably on an irradiated surface, when the light-emitting regions of every LED package 10c emit light at the same time.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting apparatus comprising:
   a mother board; and
   LED packages mounted on the mother board,
   wherein each of the LED packages comprises:
      a package substrate;
      light-emitting regions on the package substrate, the light-emitting regions being rotationally symmetric and each including LED devices, wherein at least some of the light-emitting regions and the other light-emitting regions emit light of different colors; and
      sets of package electrodes on the package substrate around the light-emitting regions, the sets of package electrodes being rotationally symmetric, wherein the package electrodes of each set correspond to cathodes and anodes of the light-emitting regions capable of emitting light independently of each other, and
   wherein the mother board includes, for each LED package, a set of mother-board electrodes connected to one of the sets of package electrodes of the LED package.

2. The light-emitting apparatus according to claim 1, wherein the sets of package electrodes in each LED package have redundancy, and the number of sets of package electrodes in each LED package is not less than the number of colors of light emitted from the light-emitting regions in the LED package.

3. The light-emitting apparatus according to claim 1, wherein the sets of package electrodes are arranged at intervals of an integer multiple of 360°/n around the center of the light-emitting regions, wherein n represents the number of light-emitting regions in each LED package.

4. The light-emitting apparatus according to claim 3, wherein the LED packages have different arrangement angles in an upper surface of the mother board with respect to a reference direction in the upper surface.

5. The light-emitting apparatus according to claim 4, wherein the arrangement angles of the LED packages differ from each other by an integer multiple of 360°/n.

6. The light-emitting apparatus according to claim 1, wherein
   each of the light-emitting regions is composed of the LED devices and a sealing resin filled on the package substrate to seal the LED devices, and
   each of the LED packages further comprises:
      a dam member on the package substrate, wherein the dam member has straight-line segments extending radially from the center of the light-emitting regions and divides the light-emitting regions; and
      conductive patterns provided on the package substrate so as not to overlap each other, the conductive patterns electrically connecting the LED devices and the sets of package electrodes, wherein each of the conductive patterns comprises a first segment extending under one of the straight-line segments of the dam member from a space between the light-emitting regions to an outer edge of the package substrate, and a second segment extending around the outer circumferences of the light-emitting regions.

7. The light-emitting apparatus according to claim 6, wherein
   each of the light-emitting regions has a fan shape,
   the light-emitting regions constitute a single circular light-emitting region,
   the conductive patterns concentrically extend around the center of the light-emitting regions outside the single circular light-emitting region, and
   the package electrodes of each set are arranged on circular arcs of the conductive patterns.

8. The light-emitting apparatus according to claim 7, wherein each of the sets of package electrodes is arranged on a single straight line passing through the center of the light-emitting regions, and
   the set of mother-board electrodes is also arranged on a single straight line, for each of the LED packages.

9. The light-emitting apparatus according to claim 1, wherein
   the mother board has openings respectively corresponding to the LED packages,
   the set of mother-board electrodes is provided on a lower surface of the mother board around each of the openings, and
   each of the LED packages is connected to the lower surface of the mother board so that the light-emitting regions are placed in one of the openings.

* * * * *